(12) United States Patent
Dedigama et al.

(10) Patent No.: US 12,089,497 B2
(45) Date of Patent: Sep. 10, 2024

(54) INDUCTION HEATING SYSTEM

(71) Applicant: MicroPower Global Limited, Tortola (VG)

(72) Inventors: Aruna R. Dedigama, San Marcos, TX (US); Cameron N. Paiga, Kyle, TX (US); Alan H. Henderson, Austin, TX (US); Thomas E. Zirkle, Scottsdale, AZ (US)

(73) Assignee: MICROPOWER GLOBAL LIMITED, Tortola (VG)

( * ) Notice: Subject to any disclaimer, the term of this patent is extended or adjusted under 35 U.S.C. 154(b) by 350 days.

(21) Appl. No.: 17/305,936

(22) Filed: Jul. 16, 2021

(65) Prior Publication Data

US 2022/0018602 A1    Jan. 20, 2022

Related U.S. Application Data

(60) Provisional application No. 63/053,429, filed on Jul. 17, 2020.

(51) Int. Cl.
*H10N 10/17* (2023.01)
*B32B 37/06* (2006.01)
*F27D 3/00* (2006.01)
*F27D 7/02* (2006.01)
*F27D 11/06* (2006.01)
*F27D 21/00* (2006.01)
(Continued)

(52) U.S. Cl.
CPC ............ *H10N 10/17* (2023.02); *B32B 37/06* (2013.01); *F27D 3/00* (2013.01); *F27D 11/06* (2013.01);
(Continued)

(58) Field of Classification Search
CPC .......... B21B 39/02; B21B 39/34; B21C 37/02; B21C 47/16; B21C 47/18; B21C 47/3433;
(Continued)

(56) References Cited

U.S. PATENT DOCUMENTS

| 2014/0097159 A1* | 4/2014 | Belnap ................ B23K 1/0008 |
| | | 219/85.22 |
| 2014/0127032 A1 | 5/2014 | Naik |

(Continued)

FOREIGN PATENT DOCUMENTS

| CN | 103691912 A | 4/2014 |
| CN | 104831083 A | 8/2015 |

(Continued)

OTHER PUBLICATIONS

Wang, CN 1821430 A (Year: 2006).*
(Continued)

*Primary Examiner* — Vy T Nguyen
(74) *Attorney, Agent, or Firm* — Abel Schillinger, LLP

(57) ABSTRACT

A thermoelectric element can comprise a thermoelectric body, a first contact, and a second contact structure, wherein the first and/or second contact structure can comprise at least one porous metal structure embedded within an outer region of the thermoelectric body, and at least one metal layer overlying the outer region of the thermoelectric body and being in direct contact with the embedded porous metal structure. A method of making the thermoelectric element can include embedding the at least one porous metal structure within the outer region of the thermoelectric body by induction heating, followed by electroplating of the at least one metal layer.

20 Claims, 11 Drawing Sheets

(51) Int. Cl.
*H05B 6/06* (2006.01)
*H05B 6/42* (2006.01)
*H10N 10/01* (2023.01)
*H10N 10/852* (2023.01)

(52) U.S. Cl.
CPC ........... *F27D 21/0014* (2013.01); *H05B 6/06* (2013.01); *H05B 6/42* (2013.01); *H10N 10/01* (2023.02); *H10N 10/852* (2023.02); *F27D 7/02* (2013.01)

(58) Field of Classification Search
CPC .. B21C 47/3483; B21D 22/022; B21D 37/16; B65G 54/02; B65H 29/006; B65H 29/20; C21D 1/04; C21D 1/42; C22C 21/02; C22C 21/06; C22C 21/10; C22C 21/12; C22F 1/02; C22F 1/04; F27D 2019/0003; F27D 99/0001; H05B 6/104; H05B 6/32; H05B 6/36
See application file for complete search history.

(56) References Cited

U.S. PATENT DOCUMENTS

| | | | |
|---|---|---|---|
| 2016/0108484 A1* | 4/2016 | Preston | C22C 45/04 |
| | | | 148/403 |
| 2018/0122719 A1 | 5/2018 | Kwak et al. | |
| 2019/0051808 A1 | 2/2019 | Larsson et al. | |

FOREIGN PATENT DOCUMENTS

| | | |
|---|---|---|
| JP | 2018-037485 A | 3/2018 |
| JP | 2018-148085 A | 9/2018 |
| KR | 10-2131924 B1 | 7/2020 |

OTHER PUBLICATIONS

JP H0559793 U (Year: 1993).*
Tanaka, JP 2006226831 A (Year: 2006).*
International Search Report, dated Nov. 1, 2021 with regard to International Application No. PCT/US2021/070897.

* cited by examiner

INDUCTION HEATING SYSTEM

CROSS-REFERENCE TO RELATED APPLICATION(S)

This application claims priority under 35 U.S.C. § 119(e) to U.S. Provisional Application No. 63/053,429, entitled "THERMOELECTRIC ELEMENT COMPRISING A CONTACT STRUCTURE AND METHOD OF MAKING THE CONTACT STRUCTURE," by Aruna R. DEDI-GAMA et al., filed Jul. 17, 2020, which application is assigned to the current assignee hereof and incorporated herein by reference in its entirety.

FIELD OF THE DISCLOSURE

The present disclosure relates to a thermoelectric element, specifically to a thermoelectric element comprising a contact structure, and a method of making the contact structure.

BACKGROUND

Thermoelectric elements are known for converting heat energy to electrical energy. Typically, a temperature gradient is formed between two opposite sides of a thermoelectric element, and the heat flow from the hot side to the cold side creates a voltage that can be trapped for operating an electrical device or being stored. In order to make efficient thermoelectric elements, an important aspect is a stable contact structure between the thermoelectric material and the heat source/cooling device which can survive tough mechanical and thermal conditions.

There exists a need to improve the contact structure of thermoelectric elements to increase the efficiency, stability, and life-time of thermoelectric elements.

BRIEF DESCRIPTION OF THE DRAWINGS

The present disclosure may be better understood, and its numerous features and advantages made apparent to those skilled in the art, by referencing the accompanying drawings.

DETAILED DESCRIPTION

As used herein, the terms "comprises," "comprising," "includes," "including," "has," "having," or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Various embodiments of the present disclosure will now be described, by way of example only, with reference to the accompanying drawings.

Figure 1:
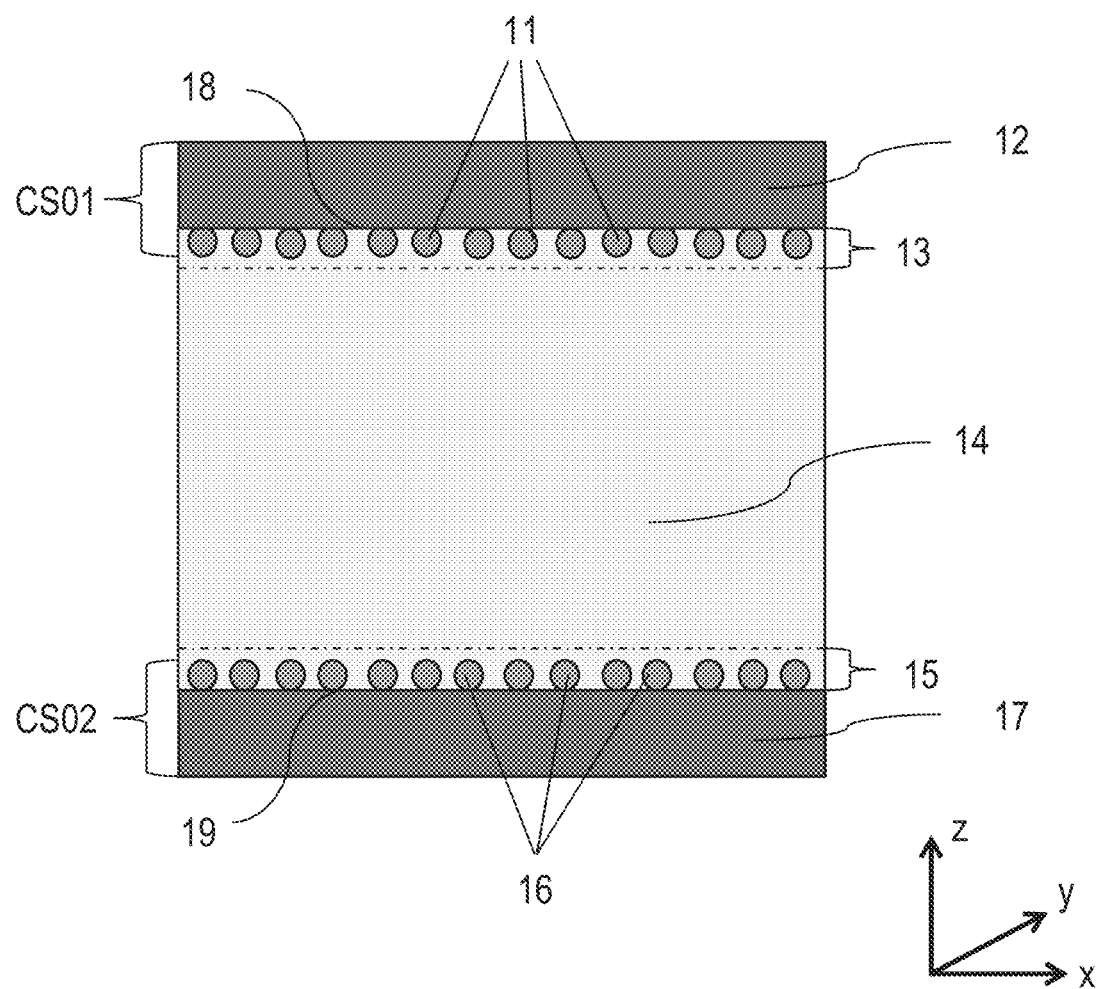
FIG. 1 includes an illustration of a thermoelectric element according to one embodiment.

In one embodiment, the present disclosure is directed to a thermoelectric element comprising a thermoelectric body, a first contact structure (CS01), and a second contact structure (CS02). As illustrated in the embodiment of FIG. 1, the first contact structure (CS01) can comprise at least one first porous metal structure (11) being at least partially embedded in a first outer region (13) of the thermoelectric body (14), and at least one first metal layer (12) overlying an outer surface (18) of the first outer region (13) and being in direct contact with the embedded first porous metal structure (11). The second contact structure (CS02) on the opposite side of the thermoelectric element may have the same structure as the first contact structure (CS01), including at least one second porous metal structure (16) embedded within a second outer region (15) of the thermoelectric body (14) and at least one second metal layer (17) overlying an outer surface (19) of the second outer region (15), and wherein the at least one second metal layer (17) can be in direct contact with the at least one second porous metal structure (16). In another aspect, not shown and further described below, the second contact structure (CS02) can have a different structure as the first contact structure (CS01).

As used herein, the term "outer region" of the thermoelectric body (14), if not stated otherwise, relates to the first and/or second outer region(s) (13, 15) of the thermoelectric body (14), which can be transformed to a softened outer region by heating to allow embedding the at least one first and/or second porous metal structure (11, 16). The outer region starts from the outer surface (18 and/or 19) of the thermoelectric body towards the center of the body (z-direction) having a thickness of at least 40 microns and not greater than 400 microns. In a certain aspect, a thickness ratio of the outer region on one side of the thermoelectric body (18 or 19) to the total thickness of the thermoelectric body (14) can be a range from 1:5 to 1:500.

As used herein, the term "porous metal structure" relates to a highly porous metal construct, which can be in embodiments a metal mesh or a metal foam.

Figure 2:
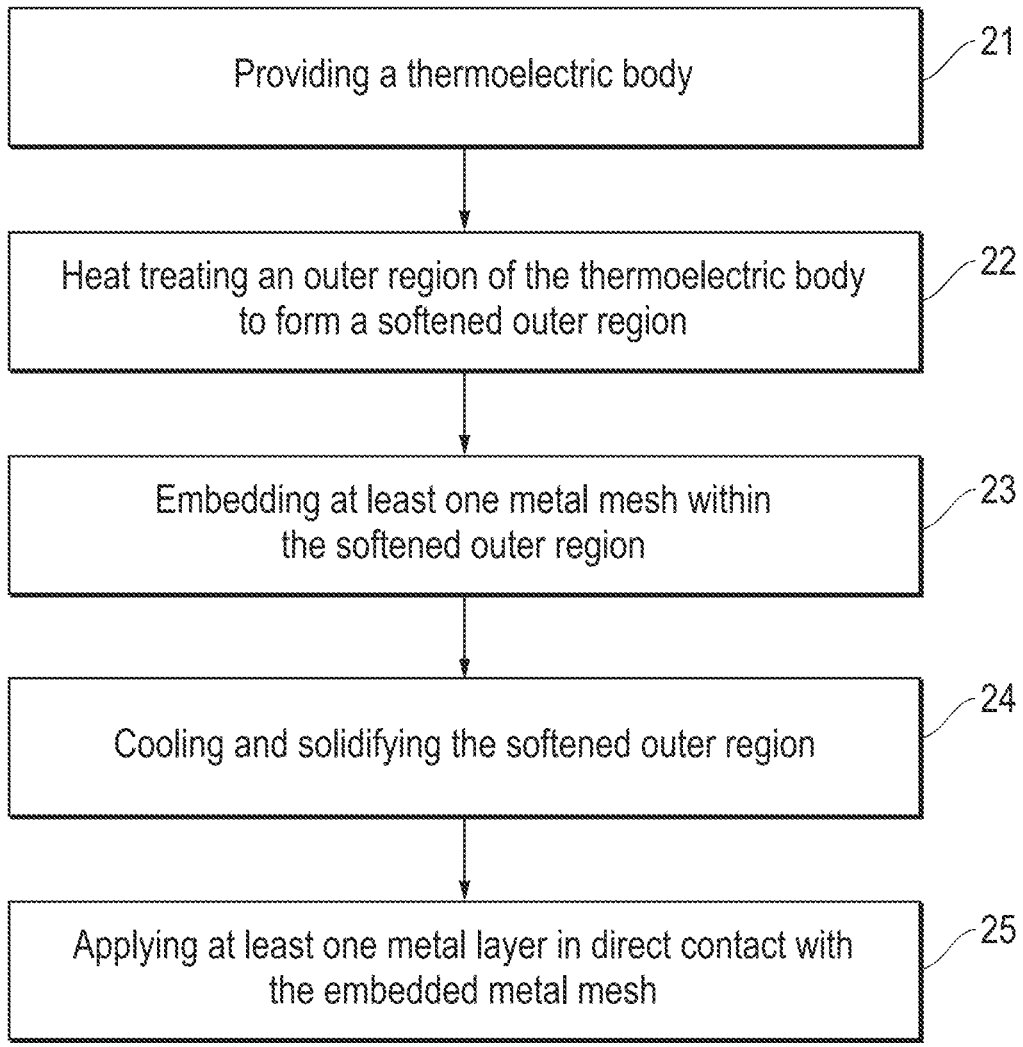
FIG. 2 includes a scheme of a method of forming a contact structure according to one embodiment.

The present disclosure is further directed to a method of forming a contact structure on a thermoelectric body. In one embodiment, as illustrated in FIG. 2, the method can comprise: providing a thermoelectric body (21); heat treating an outer region of the thermoelectric body (22), wherein heat treating can cause partial melting of the outer region and forming of a softened outer region; embedding at least one porous metal structure within the softened outer region (23); cooling and solidifying the softened outer region (24); and applying at least one metal layer overlying the outer region (25), wherein the at least one metal layer can be in direct contact with the at least one partially embedded porous metal structure.

Figure 3A:
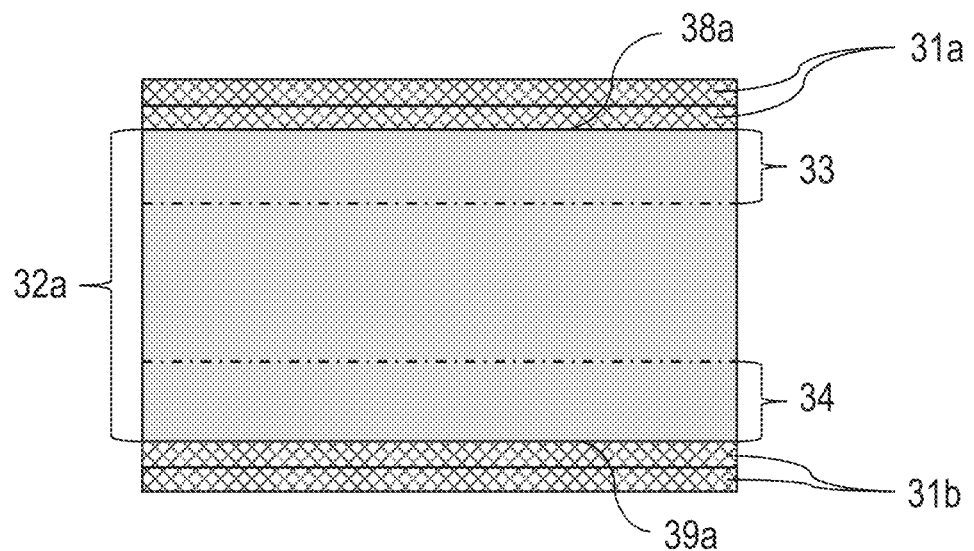
FIG. 3A includes an illustration of a step of the process of making a contact structure according to one embodiment.

FIG. 3A illustrates an embodiment wherein two porous metal structures (31a), for example, two metal meshes, can be positioned directly next to the outer surface (38a) of a first outer region (33) of the thermoelectric body (32a); and two porous metal structures (31b), may be positioned next to the outer surface (39a) of a second outer region (34), of the thermoelectric body (32a).

In other embodiments, the at least one porous metal structure can include a total of one to five porous metal structures, such as one porous metal structure, or two porous metal structures, or three porous metal structures, or four porous metal structures, or five porous metal structures. In a certain particular aspect, the at least one porous metal structure may include two porous metal structures.

The at least one porous metal structure can have a thickness of at least 40 microns, or at least 50 microns, or at least 70 microns, or at least 80 microns, or at least 100 microns, or at least 120 microns. In another aspect, the thickness of the at least one metal mesh may be not greater than 500 microns, or not greater than 300 microns, or not greater than 250 microns, or not greater than 200 microns, or not greater than 150 microns, or not greater than 120 microns, or not greater than 100 microns. As used herein, the thickness of the at least one porous metal structure relates to the combined thickness of all porous metal structures together before embedding within the thermoelectric body.

In one aspect, the at least one porous metal structure can be a metal mesh. In a particular aspect, the metal mesh may be a nickel mesh. The metal mesh can have a mesh size of at least 100 mesh, or at least 150 mesh, or at least 200 mesh, or at least 300 mesh. In a further aspect, the mesh size may be not greater than 460 mesh, or not greater than 400 mesh or not greater than 350 mesh or not greater than 300 mesh. In a further aspect, the metal mesh can have a mesh count of at least 100 mesh/inch, or at least 200 mesh/inch, or at least 350 mesh/inch. In yet another aspect, the mesh count may not be greater than 460 mesh/inch, or 400 mesh/inch, or 360 mesh/inch.

In yet a further aspect, the metal mesh can have a wire diameter of at least 15 microns, or at least 20 microns, or at least 25 microns, or at least 30 microns. In another aspect, the wire diameter of the metal mesh may be not greater than 50 microns, or not greater than 40 microns, or not greater than 35 microns.

In another aspect, the at least one porous metal structure can be a metal foam. In a particular aspect, the metal foam can be a nickel foam.

In a certain aspect, the metal foam can have a porosity between 10 vol % to 95 vol %, such as at least 15 vol %, at least 20 vol %, at least 25 vol %, at least 30 vol %, at least 35 vol %, at least 40 vol %, or at least 50 vol %. In another aspect, the porosity of the metal foam may be not greater than 90 vol %, or not greater than 80 vol %, or not greater than 70 vol %, or not greater than 60 vol %.

The average pore size of the metal foam can range from at least 0.01 mm to not greater than 0.3 mm, such as at least being 0.02 mm, or at least 0.05 mm, or at least 0.1 mm and not greater than 0.25 mm, or not greater than 0.2 mm, or not greater than 0.15 mm.

In a further aspect, the metal foam can consist essentially of nickel and may have a density of at least 1.5 g/cm$^3$, or at least 2.0 g/cm$^3$, or at least 2.5 g/cm$^3$, or at least 3.0 g/cm$^3$. In another aspect, the density of the foam may be not greater than 3.5 g/cm$^3$, or not greater than 3.3 g/cm$^3$, or not greater than 3.0 g/cm$^3$. In a particular aspect, the density of the nickel foam can be at least 2.5 g/cm$^3$ and not greater than 3.5 g/cm$^3$.

In a certain particular aspect, the metal foam can be a nickel foam and may have a thickness between 70 microns and 120 microns and a density between 2.5 g/cm$^3$ to 3.5 g/cm$^3$.

In a further aspect, the metal foam can be a nickel foam having a tensile strength in a length direction of at least 1.25 N/mm2, and in its width direction of at least 1.0 N/mm2.

As used herein, the parameters of the metal mesh or metal foam, are parameters before embedding the mesh or foam within the thermoelectric body and these parameters can vary to a certain degree after embedding.

In another embodiment of the method, the thermoelectric body can include before heat treating at least one provisional metal layer (also called herein "sacrificial metal layer") directly overlying the outer region of the thermoelectric body. The at least one provisional metal layer can react during induction heating with the material of the thermoelectric body and may thereby be consumed. In a certain aspect, the inclusion of such at least one provisional metal layer can further enhance the lifetime of the contact structure of the thermoelectric element.

In one aspect, the at least one provisional metal layer can include the same type of metal as the nickel meshes to be embedded within the outer regions of the thermoelectric body. In a certain aspect the at least one provisional metal layer may include a first provisional nickel layer directly overlying an outer region of the thermoelectric body, and a second provisional nickel layer directly overlying the first provisional nickel layer. The first provisional nickel layer can have a thickness of at least 20 nm and not greater than 1 micron, while the second nickel layer may have a thickness of at least 1 micron and not greater than 6 microns. In a certain aspect, the first provisional nickel layer can have a higher stress than the second provisional nickel layer. In a particular embodiment, the at least one provisional metal layer can include two provisional nickel layers and a material of the thermoelectric body may include PbTe.

In one embodiment, heat treating of the outer region of the thermoelectric body can be conducted by heating this region close to a melting temperature of the material of the thermoelectric body and for a time that only the outer region is submitted to partial melting and softening and to forming a softened outer region. In one aspect, heat treating can be conducted by heating the outer region to a maximum temperature, wherein the maximum temperature may be at least the melting temperature of the thermoelectric material. In a certain aspect, the maximum temperature during heat treating may be not greater than 100° C. above the melting temperature of the material of the thermoelectric body, such as not greater than 50° C., or not greater than 30° C. or not greater than 20° C., or not greater than 10° C.

In one embodiment, heat treating of the outer region of the thermoelectric body can be conducted by induction heating of the porous metal structure positioned next to the outer region. By placing the porous metal structure directly next to the outer region of the thermoelectric body, the heat generated within the porous metal structure during induction heating may function as a direct heat source for partially melting and softening the outer region of the thermoelectric body.

Induction heating can have the advantage of reaching the desired maximum temperature within a very short time and allowing to control the heat treatment in a time interval of even 5 to 10 seconds. Such short and controlled heating can allow a melting of only a defined outer region of the thermoelectric body suitable for embedding the at least one metal mesh, while the majority of the thermoelectric body can remain solid and maintain its structure.

In one aspect, the induction heating can be performed that a temperature of the heating element positioned at a defined distance next to the porous metal structures, herein also called tooling temperature, is at least 300° C. and not greater than 500° C. Such tooling temperature range can convert to a temperature within the porous metal layers from about 600° C. to about 1100° C.

In a particular embodiment, the heat treatment can include heating to a maximum tooling temperature of at least 320° C., or at least 340° C., or at least 360° C., or at least 380° C., or at least 400° C., or at least 420° C., or at least 440° C. In another embodiment, the maximum tooling temperature of the heat treatment may be not greater than 440° C. or not greater than 420° C. or not greater than 400° C. or not greater than 380° C. or not greater than 360° C. or not greater than 340° C.

In a particular aspect, induction heating can comprise two steps: 1) a first heat treatment, wherein the tooling (induction coil) can be heated to a lower preheat tooling temperature in a range of between 110° C. to 150° C. and maintained at this temperature for about 40-200 seconds, followed 2) by a second heat treatment, wherein the tooling can be heated to a high tooling temperature $T_{max}$ and maintained at $T_{max}$ for about 1-20 seconds, followed by free cooling. The $T_{max}$ temperature of the tooling can be selected that it corresponds to temperature within the porous metal structure being close to the melting temperature of the material of the thermoelectric body.

In one aspect, the induction heating can cause a heating of the porous metal structures to at least 350° C., or at least 400° C., or at least 500° C., or at least 600° C., or at least 630° C., or at least 650° C., or at least 700° C., or at least 750° C., or at least 800° C., or at least 900° C. In another aspect, the temperature of the porous metal structures may be not greater than 1100° C., or not greater than 1000° C., or not greater than 950° C., or not greater than 920° C., or not greater than 900° C., or not greater than 850° C., or not greater than 800° C., or not greater than 750° C., or not greater than 700° C., or not greater than 650° C.

To assure that only the outer region of the thermoelectric body is melted, induction heating at the maximum tooling temperature $T_{max}$ can be conducted for at least 5 seconds and not greater than 20 seconds, or at least 5 seconds and not greater than 15 seconds, or at least 5 seconds and not greater than 12 seconds, or at least 5 seconds and not greater than 10 seconds.

In one embodiment, the induction heating during the second heat treatment can be regulated by measuring the electric current flow through the induction coil circuit. In a certain aspect, the second heat treatment can be terminated when detecting an increase of the electric current by about 3-5 percent compared to the electric current measured when reaching the maximum tooling temperature, herein also called "$A_{Tmax-b}$," i.e., the electric current at the beginning of the second heat treatment maximum temperature.

Accordingly, for controlling the time during the second heat treatment, the following equation can be applied: $A_S = A_{Tmax-b} + \Delta A$, with $A_S$ being the current when stopping the induction heating, $A_{Tmax-b}$ being the electric current measured when reaching the maximum temperature of the second heat treatment, and $\Delta A$ the current increase of 3-5% based on $A_{Tmax-b}$. Not being bound to theory, the increase in the electric current in the induction heating coil circuit by 3-5% can be an indication that the porous nickel structure at least partially reacted with the material of the thermoelectric body, which may cause a drop in the electromagnetic permeability of the nickel structure, and thereby can cause an increase in the electric current of the induction heating coil.

During heat treatment at the maximum temperature, the outer region of the thermoelectric body can be melted and a softened outer region can be formed, which allows embedding of the at least one porous metal structure within the softened outer region. As used herein, the term "softened" is interchangeably used with "at least partially melted" and refers to the stage that the metal mesh can be embedded within the outer region.

In one aspect, embedding the at least one porous metal structure within the softened outer region can be conducted by applying a pressure on the at least one porous metal structure during or after induction heating. In a certain aspect, the applied pressure on the porous metal structure can be at least 5 psi, or at least at least 8 psi, or at least 10 psi. In another certain aspect, the pressure may be not greater than 15 psi, or not greater than 12 psi, or not greater than or not greater than 10 psi.

Figure 3B:
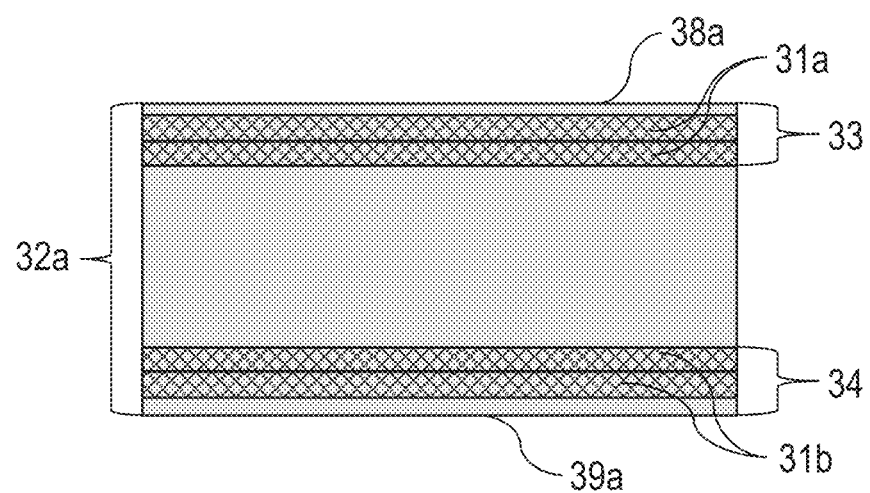
FIG. 3B includes an illustration of a step of the process of making a contact structure according to one embodiment.

FIG. 3B illustrates an embodiment wherein the at least one first porous metal structure (31*a*) and the at least one second porous metal structure (31*b*) shown in FIG. 3A are completely embedded within the first outer region (33) and the second outer region (34) of the thermoelectric body (32*a*), respectively.

In another embodiment, the at least one porous metal structure can be only partially embedded within the outer region of the thermoelectric body. In certain aspects, at least 80 vol % of the porous metal structure can be embedded within the outer region, or at least 85 vol %, or at least 90 vol %, or at least 95 vol %, or at least 98 vol %. In other certain aspects, not greater than 99 vol % of the porous metal structure may be embedded, or not greater than 98 vol %, or not greater than 95 vol %, or not greater than 90 vol %.

Figure 3C:
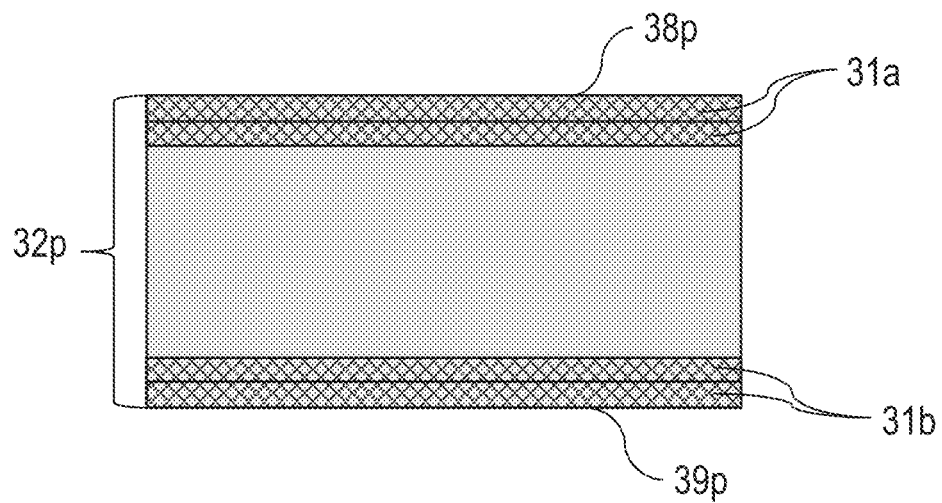
FIG. 3C includes an illustration of a step of the process of making a contact structure according to one embodiment.

If the at least one porous metal structure is completely embedded within the thermoelectric body, polishing can be conducted to remove the material of the thermoelectric body which covers the at least one porous metal structure, until portions of the at least one porous metal structure reach the outer surface of the thermoelectric body. FIG. 3C illustrates the thermoelectric body of FIG. 3B after polishing, wherein the at least one first porous metal structure (31*a*) and the at least one second porous metal structure (31*b*) are level with the polished outer surface (38p) and the polished outer surface (39p), of the polished thermoelectric body (32p), respectively.

Figure 3D:
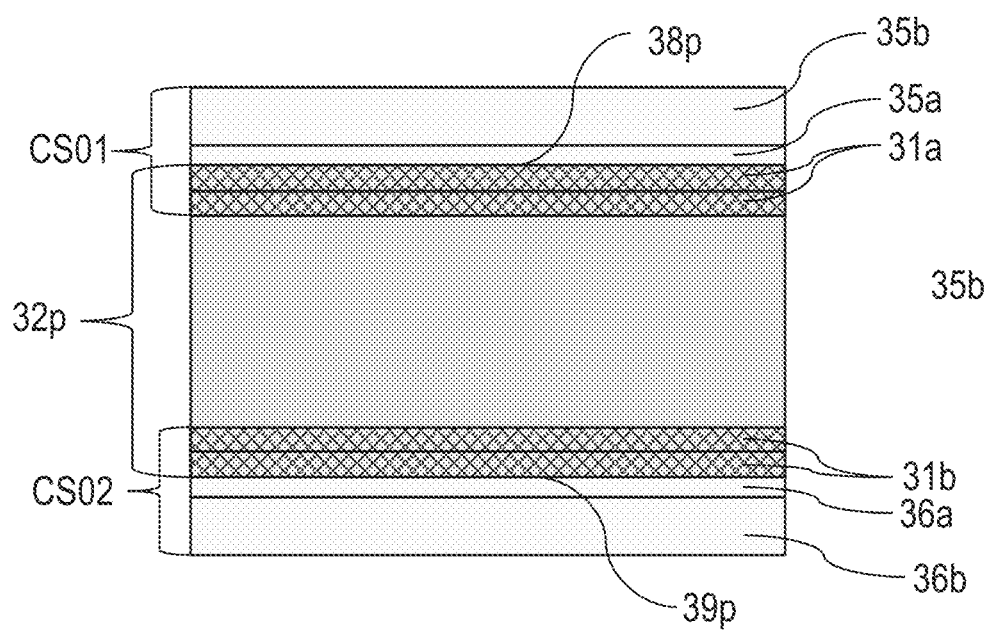
FIG. 3D includes an illustration of a thermoelectric element including two contact structures which was arrived from the intermediate structures shown in FIGS. 3A-3C according to one embodiment.

FIG. 3D illustrates an embodiment, wherein on each outer surface of the polished thermoelectric body shown in FIG. 3C furthermore two metal layers are applied: a first metal layer (35a) being in direct contact with the at least one first embedded porous metal structure (31a), and a second metal layer (36a) directly overlying the first metal layer (35a). On the opposite side, a first metal layer (35b) being in direct contact with the at least one second porous metal structure (31b), and a second metal layer (36b) directly overlying the first metal layer (35b). As further illustrated in FIG. 3D, the first contact structure (CS01) can include two metal meshes of the at least one first porous metal structure (31a), the first metal layer (35a) and the second metal layer (36a); and the second contact structure (CS02) on the opposite side may include the two metal meshes of the at least one second porous metal structure (31b), the first metal layer 35b and the second metal layer 36b.

Non-limiting examples of the at least one porous metal structure and of the at least one metal layer can be nickel, copper, titanium, palladium, cobalt, molybdenum, iron, aluminum, or metal alloys. As used herein, the terms "porous metal structure" or "metal layer" mean that the majority of the material is metal, but other non-metal elements or additives may be also included to a minor content of up to 20 wt %, for example, phosphorus, carbon, silicon, nitrogen, boron, or any combination thereof. In a certain aspect, the at least one porous metal structure and the at least one metal layer can include the same metal. In a particular embodiment, the at least one porous metal structure and the at least one metal layer may include nickel. In a certain particular aspect, the at least one porous metal structure and the at least one metal layer may consist essentially of nickel. As used herein, consisting essentially of nickel means having a nickel content of at least 98 wt %. In a particular certain aspect, the at least one porous metal structure and/or at least one metal layer can have a nickel content of at least 99.0 wt %, or at least 99.5 wt % or at least 99.9 wt %.

In one embodiment, the first metal layer (35a, 36a) can have a lower thickness than the second metal layer (35b, 36b). In a certain aspect, a thickness ratio of the first metal layer to the second metal layer can be not greater than 0.1, such as not greater than 0.05, or not greater than 0.033, or not greater than 0.025, or not greater than 0.02, or not greater than 0.017, or not greater than 0.014.

In one aspect, the average thickness of the first metal layer (35a, 36a) can be at least 10 nm, or at least 30 nm, or at least or at least 50 nm, or at least 100 nm, or at least 150 nm, or at least 200 nm. In another aspect, the average thickness of the first metal layer may be not greater than 2000 nm or not greater than 1500 nm or not greater than 1000 nm or not greater than 800 nm or not greater than 500 nm or not greater than 300 nm. The average thickness of the first metal layer can be a value between any of the minimum and maximum values noted above.

In a further aspect, the average thickness of the second metal layer (35b, 36b) can be at least 3 microns, or at least 5 microns, or at least 10 microns, or at least 50 microns, or at least 80 microns, or at least 100 microns, or at least 150 microns. In another aspect, the average thickness of the second metal layer may be not greater than 200 microns, or not greater than 180 microns, or not greater than 160 microns, or not greater than 140 microns, or not greater than 120 microns. The average thickness of the second metal layer can be a value between any of the minimum and maximum values noted above.

In one embodiment, the first metal layer (35a, 36a) and the second metal layer (35b, 36b) can consist essentially of nickel, herein also called first nickel layer and second nickel layer, wherein a stress of the second nickel layer (35b, 36b) may be lower than a stress of the first nickel layer (35a, 36a). In one aspect, the stress of the first nickel layer can be at least 70 MPa, or at least 100 MPa, or at least 150 MPa, or at least 300 MPa, or at least 400 MPa, or at least 500 MPa, or at least 600 MPa, or at least 650 MPa, or at least 700 MPa, or at least 750 MPa, or at least 800 MPa. In a further aspect, the stress of the first nickel layer can be not greater than 1500 MPa, or not greater than 1300 MPa, or not greater than 1100 MPa.

In a further aspect, the stress of the second nickel layer can be at least 5 MPa, or at least 10 MPa, or at least 50 MPa, or at least 100 MPa, or at least 150 MPa. In yet another aspect, the stress of the second nickel layer may be not greater than 630 MPa, or not greater than 600 MPa, or not greater than 550 MPa, or not greater than 500 MPa, or not greater than 450 MPa, or not greater than 400 MPa, or not greater than 350 MPa, or not greater than 300 MPa, or not greater than 150 MPa, or not greater than 100 MPa, or not greater than 80 MPa.

In a certain aspect, the stress of the second nickel layer can be at least 50 percent lower than a stress of the first nickel layer, such as at least 70 percent lower, at least 100 percent lower, at least 150 percent lower, or at least 200 percent lower.

In one aspect, the first metal layer (35a, 36a) and the second metal layer (35b, 36b) can be applied by electroplating. It is appreciated that any other process known in the art for depositing a metal layer can be also used, for example, electroless metal plating, or dip coating, or chemical vapor deposition.

In a particular aspect, the first metal layer (35a, 36a) and the second metal layer (35b, 36b) can be formed by conducting electroplating of nickel. In order to produce nickel layers with different phases, electroplating can be conducted at different pH ranges. In one aspect, the first nickel layer can be formed by electroplating of nickel at a pH between 7.5 and 8.5, while the second nickel layer may be formed by electroplating of nickel at a pH between 3.5 and 4.5. In a particular aspect, the first nickel layer can be formed by electroplating nickel at a pH between 7.70 and 8.06, and the second nickel layer may be applied by nickel electroplating at a pH between 3.6 and 4.3.

The thermoelectric body of the thermoelectric element of the present disclosure can comprise any thermoelectric material suitable for converting thermal energy to electrical energy.

In one aspect, the material of the thermoelectric body can be an n-type semiconductor material. In a particular aspect, the n-type semiconductor material can include lead telluride (PbTe).

In another aspect, the thermoelectric body can include a p-type semiconductor material. In a certain aspect, the p-type semiconductor material can be a material including tellurium/antimony/germanium/silver (Te/Sb/Ge/Ag), herein also called "TAGS."

Figure 4:
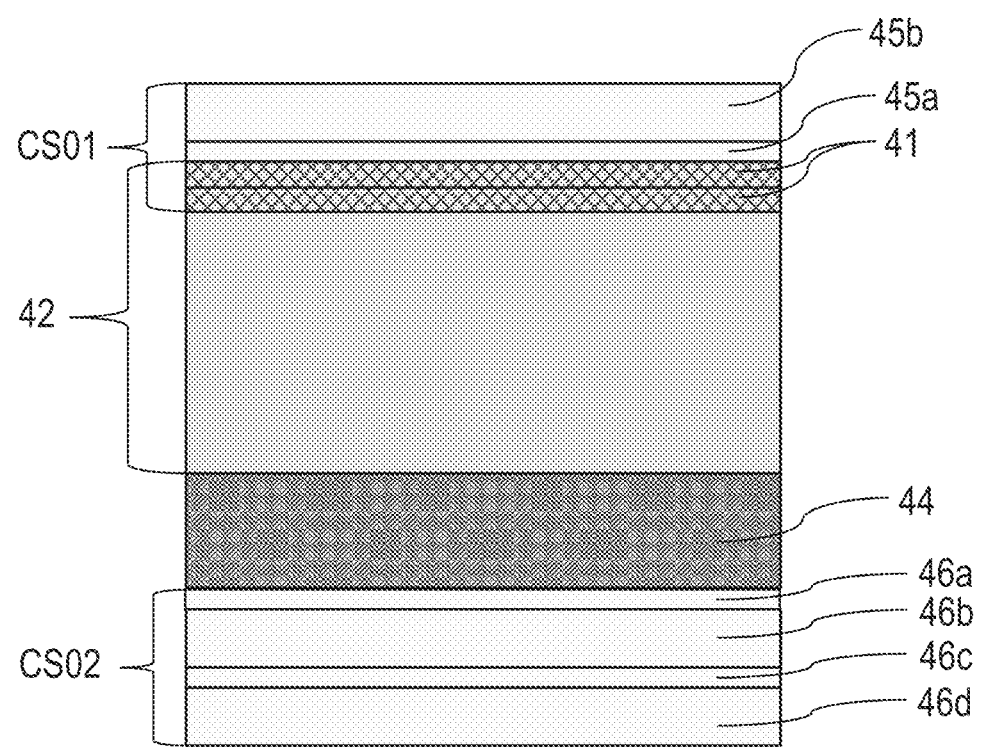
FIG. 4 includes an illustration of a thermoelectric element according to one embodiment.

In a further embodiment, the thermoelectric element of the present disclosure can comprise a thermoelectric body, a first contact structure second (CS01), and a second contact structure (CS02), wherein the first contact structure may be the same as described above, but the second contact structure (CS02) may be different than the first contact structure (CS01). In one aspect, the second contact structure may include at least one metal layer directly overlying the thermoelectric body and no embedded porous metal structure. In a certain aspect, as illustrated in FIG. 4, the second contact structure (CS02) can be a combination of four metal layers (46 a, b, c, and d) including the same metal. In a certain aspect, the four metal layers can all include nickel. The four nickel layers can have a first nickel layer (46a) and a second nickel layer (46b), which can correspond to the first nickel layer (45a) and the second nickel layer (45b) of the first contact structure (CS01), as also described above for varying thickness and stress. The third nickel layer (46c) and fourth nickel layer (46d) may be a repetition of the first nickel layer (46a) and the second nickel layer (46b). If a four nickel layer structure is applied as the second contact structure, induction heating can be conducted after applying the second nickel layer (46b) and before depositing the third nickel layer (46c). Induction heating can cause a partial melting of the outer region of the thermoelectric body and a stronger bond of the first and second nickel layers to the thermoelectric body. A four nickel layer structure as a second contact structure can be applied on the intended "cold side" of a thermoelectric body, which means across the side of the body which will be closest to a heat source for forming a thermal gradient.

The use of two different contact structures may be considered in an embodiment wherein between the second contact structure (CS02) and the thermoelectric body (42), a further functional layer (44) may be included. For example, the functional layer (44) can be, another semiconductor layer or a barrier layer. In a non-limiting embodiment, the functional layer (44) can be the same type of semiconductor as the thermoelectric body, wherein the two semiconductors may differ by n-type doping and p-type doping. In another embodiment, the functional layer can be a different type of semiconductor material, such as that the thermoelectric body is a p-type semiconductor and the additional functional layer can be an n-type semiconductor, or that the thermoelectric body may be an n-type semiconductor and the additional functional layer can be a p-type semiconductor. In a certain aspect, the thermoelectric body (42) may be an n-type PbTe material and the other functional layer (44) can be a layer of Iridium (Ir) or Titanium (Ti). In another certain aspect, the thermoelectric body (42) can be a TAGS material and the functional layer (44) can be a tantalum (Ta) layer.

In another aspect, the functional layer (44) can also be included in the thermoelectric element of the present disclosure if the first contact structure (CS01) and the second contract structure (CS02) are the same.

In a further embodiment of the present disclosure, an outer metal layer can be applied on the first and/or second contact structure, wherein the outer metal layer can include a different metal than the metal layers of the first and/or second contact structure. In one aspect, the outer metal layer can be a layer including silver, herein also called silver layer. In a certain aspect, the silver layer can be applied by electro-deposition from a silver salt solution.

Figure 7:
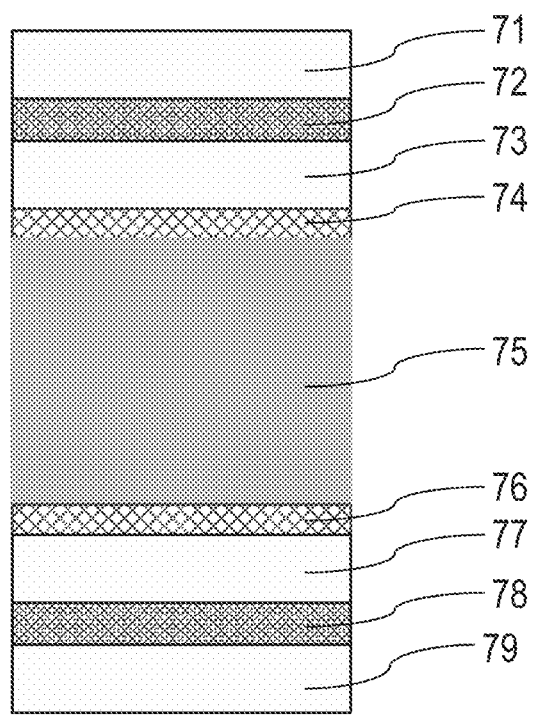
FIG. 7 includes an illustration of an arrangement configured for induction heating using an induction heating system according to one embodiment.

In a particular embodiment, forming the first and a second contact structure described above on a thermoelectric body can comprise assembling an arrangement, and subjecting the arrangement to induction heating. In one aspect, the arrangement can include in the center the thermoelectric body, surrounded by the at least one first porous metal structure and the at least one second porous metal structure. In a particular aspect, the arrangement can have a layer structure of the following order, as also illustrated in FIG. 7: a first heat spreading layer (71); a first induction heat absorber layer (22); a second heat spreading layer (73), at least one first porous metal structure (74), a thermoelectric body (75), at least one second porous metal structure (76), a third heat spreading layer (77), a second induction heat absorber layer (78), and a fourth heat spreading layer (79).

In a particular aspect, all four heat spreading layers (71, 73, 77, 79) can include the same material, for example, graphite or sapphire. The thickness of each heat spreading layer can be from 0.2 mm to 2.5 mm.

In another aspect, the material of the first and second induction heat absorber layers (72, 78) can be nickel, copper, or stainless-steel, and be provided in form of a porous metal structure or a fully formed plate. In a particular aspect, the material of the heat absorber layers (72, 78) may be the same as the material of the at least one first and second porous metal structure (74, 76). The thickness of each induction heat absorber layer can be from 0.04 mm to 2.0 mm. The selection of a certain thickness of the heat spreading layers and the heat absorber layers may help to optimize the heating conditions during induction heating.

The inclusion of the first and second induction heat absorber layers (72, 78) surrounded by the head spreading layers can have the advantage of providing rapid and stable heat at both sides of the thermoelectric body throughout the process of embedding the porous metal structures (74, 76) within the outer regions of the thermoelectric body. While the porous metal structures (74, 76) can contribute initially to the heating of the first and second outer regions of the thermoelectric body, the effectiveness of the heating decreases during the actual embedding of the metal meshes. The heat absorber layers (72, 78) surrounded by the heat spreading layers (71, 73, 77, 79) can further help to apply an even pressure throughout the area of the at least one first and at least one second porous metal structure (74, 76) for embedding the porous structures within the outer regions of the thermoelectric body.

Figure 8:
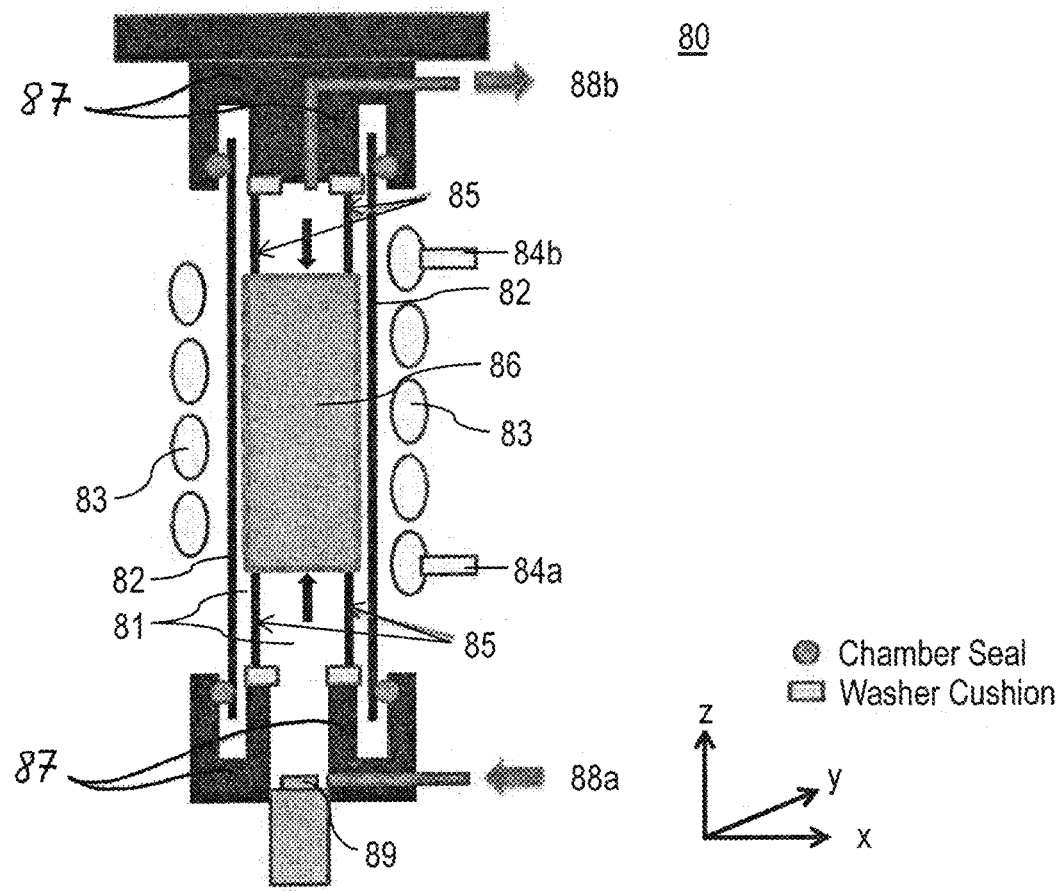
FIG. 8 includes an illustration of an induction heating system according to one embodiment.

An embodiment of a heating system configured for induction heating the above-described arrangement such that the at least one first porous metal structure and the at least one second porous metal structure can be embedded within the outer regions of the thermoelectric body is illustrated in FIG. 8.

The heating system (80) can include a furnace chamber (81) having a furnace wall (82) made of a non-conductive and non-magnetic material. In a certain embodiment, the furnace wall (82) can have a circular shape forming a cylindrical furnace chamber (81). At least one induction heating coil (83) can surround the furnace wall (82) from the outside. In a certain aspect, the distance ($d_i$) of the induction heating coil (83) to the furnace wall (82) can be adjusted and may vary from 0 mm to 10 mm. The distance ($d_i$) is however not limited to a range of 0 to 10 mm and can be up to 100 mm or greater for other applications of the heating system (80). In another certain aspect, the induction heating coil (83) can be hollow and cold air may flow through the hollow coil during operation of the heating system, specifically during induction heating and cooling of the coil. A non-limiting example of a flow rate of the air can be 0.5 l/min.

In one aspect, the cold air can enter the coil at a bottom entrance (84a) and leave it at a top exit (84b). The heating system (80) can further include a holding and pressing construction (85) which can hold and apply a desired pressure on an inserted arrangement (86) if placed within the furnace chamber (81). The holding and pressing construction (85) can include movable pedestals (87) which can be attached to the outer top (86a) and outer bottom of the arrangement (86) and may be designed to apply a desired pressure in a length direction (z) from both sides of the arrangement in an upward and downward direction, respectively. The holding and pressing construction (85) can ensure that the arrangement (86) is held together under a certain pressure which also allows embedding of the at least one first porous metal structure and the at least one second porous metal structure within the first and second outer regions of the thermoelectric body after softening these regions, respectively. In one aspect, the pressure applied by the holding and pressing construction of the arrangement can be in a range of 5 psi to 15 psi.

The furnace chamber (81) can further include a gas inlet (88a) and a gas outlet (88b) for allowing a gas flow through the furnace chamber, for example, when working under oxygen-free conditions. In one aspect, the gas flowing through the chamber can be an argon gas, also called a forming gas, containing 95% argon and 5% hydrogen. In a certain aspect, the argon gas can flow through the furnace at a flow rate of at least 40 ml/min, or at least 50 ml/min, or at least 70 ml/min, or at least 100 ml/min at a corresponding volume of the furnace of about 100 cm$^3$. In another certain aspect, the flow rate may be not greater than 150 ml/min, or not greater than 120 ml/min.

A temperature sensor (89) may be further placed within the chamber (81) for controlling and regulating the temperature of the at least one porous metal structure contained within an inserted arrangement (86). In one aspect, the temperature sensor can be an IR temperature sensor. The IR temperature sensor can measure the temperature of the outer heat spreading layers (71 or 79), which can provide an indirect relative temperature indication of the porous metal structures (74, 76) and the outer regions of the thermoelectric body (75).

Figure 9:
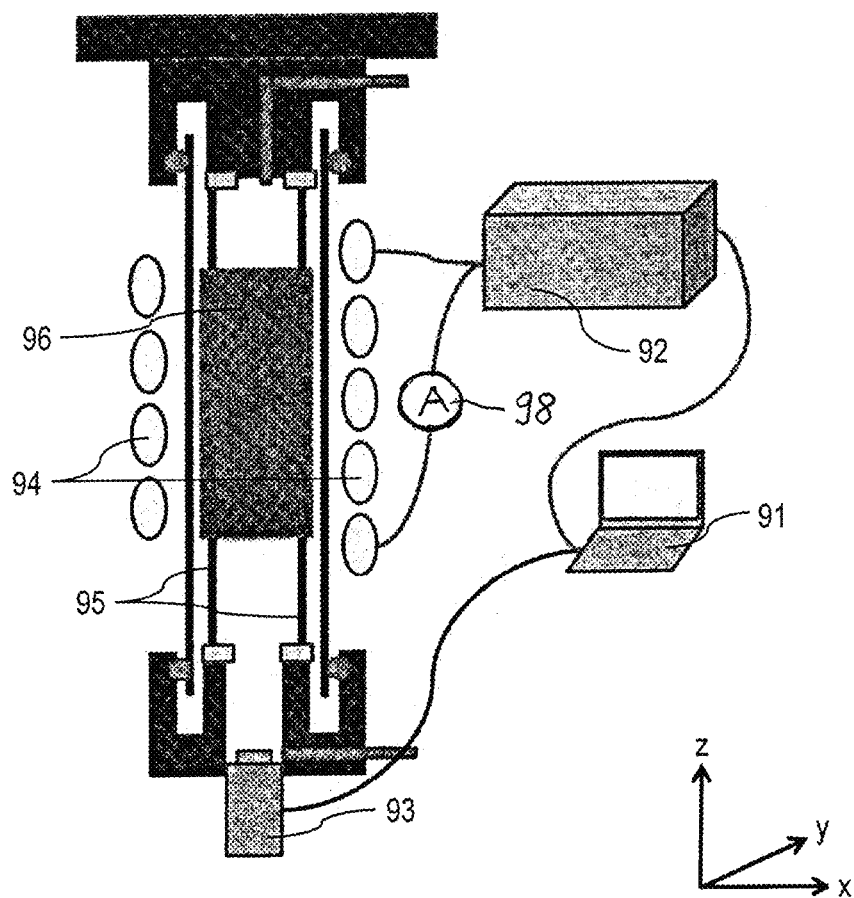
FIG. 9 includes an illustration of an induction heating system according to one embodiment.

The induction heating system can further comprise a control unit, for example, a computer, to coordinate the induction heating. In one embodiment, as illustrated in FIG. 9, the induction heating system (90) can include a control unit (91), which can be connected to an induction heating device (92) and a temperature sensor (93) contained in the furnace chamber. Based on the information obtained by the temperature sensor and the material type of thermoelectric body, the control unit can determine the needed current frequency and time for operating the induction heating device (92) connected to the induction coils (94). In one aspect, the applied current frequency can be at least 80 kHz or at least 100 kHz, or at least 200 kHz. In another aspect, the current frequency may be not greater than 10 MHz, or 1 MHz, or 500 kHz. The control unit (91) may further regulate and initiate the cooling after the induction heating, for example, initiating the flow of cool air through the hollow induction spirals. In a further aspect, the control unit can further regulate the pressure applied by the holding and pressing construction on an arrangement.

In another aspect, the electric current flowing through the induction coils (94) can be measured and sent to the control unit. The control unit can be configured that at a certain maximum current flow, the induction heating is stopped or interrupted. For example, as described above, the exact current drawn by the induction heating circuit of the at least one induction coil (94) can be measured with an ampere meter (98) and the ampere meter may be connected to the control unit. The control unit may record any changes of the electric current from the beginning of the second heat treatment ($T_{max-b}$) and can initiate at a current increase of 3-5% the induction heating to be stopped by communication with the induction heating device. For example, the control unit may register a current of 9 A at the beginning of the second heat treatment when reaching $T_{max}$ and can initiate to stop the induction heating when the current reaches 9.3 A.

The induction heating device can operate during the two temperature treatments such that during the first heat treatment, a defined input power to the induction coil circuit can be regulated via a duty cycle (for example, the power can be ON for 0.125 seconds and OFF for 0.125 seconds to maintain the temperature at 160° C., which is called herein a 50% duty cycle). During the second temperature heat treatment, the duty cycle can be changed to 100%, which means the selected power is ON all the time, and the current increase to evaluate the termination of the heating can be observed and monitored.

Controlling the increase in the current flow in the at least one induction heating coil circuit can increase the sensitivity of the method by stopping the heating exactly at the appropriate time that the metal porous structure is embedded within the thermoelectric body and may prevent overheating and unnecessary damage of the thermoelectric body by excessive melting. The method of observing the current can be more sensitive than measuring the temperature with the IR sensor since the IR sensor can only indirectly provide information about the actual temperature at the outer region of the thermoelectric body by measuring the temperature of the outer heat spreading layer.

The thermoelectric element of the present disclosure can be adapted for converting heat energy from a heat source to electrical energy, wherein the heat source can have a temperature in a range of at least 100° C. and not greater than 600° C. Furthermore, a plurality of thermoelectric elements of the present disclosure can be assembled to a thermoelectric device for converting heat energy to electrical energy on a larger scale.

As further demonstrated in the examples, the above-described method can produce thermoelectric elements with strong and high stress tolerating contact structures which can provide a long lifetime of the thermoelectric elements. Not being bound to theory, the embedded metal meshes within the outer regions of the thermoelectric body can provide a reinforced structure as a basis for a strong hold of the applied metal layers of the contact structure, while the thermoelectric properties of the thermoelectric body can be maintained.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

EMBODIMENTS

Embodiment 1. A thermoelectric element comprising: a thermoelectric body, a first contact structure, and a second contact structure, wherein
the first contact structure comprises at least one first porous metal structure and at least one metal layer, wherein the at least one first porous metal structure is at least partially embedded within a first outer region of the thermoelectric body, and the at least one metal layer is overlying an outer surface of the first outer region of the thermoelectric body and in direct contact with the at least one metal mesh.

Embodiment 2. The thermoelectric element of embodiment 1, wherein the at least one metal layer comprises a first metal layer and a second metal layer, and wherein each of the at least one first porous metal structure, the first metal layer, and the second metal layer include the same metal.

Embodiment 3. The thermoelectric element of embodiment 2, wherein each of the at least one first porous metal structure, the first metal layer, and the second metal layer comprise nickel.

Embodiment 4. The thermoelectric element of embodiments 2 or 3, wherein each of the at least one first porous metal structure, the first metal layer, and the second metal layer consist essentially of nickel.

Embodiment 5. The thermoelectric element of any one of the preceding embodiments, wherein the at least one first porous metal structure comprises two porous metal structures.

Embodiment 6. The thermoelectric element of any one of the preceding embodiments, wherein the at least one first porous metal structure has a thickness of at least 30 microns and not greater than 175 microns.

Embodiment 7. The thermoelectric element of any one of the preceding embodiments, wherein at least 90 vol % of the at least one first porous metal structure is embedded within the first outer region of the thermoelectric body.

Embodiment 8. The thermoelectric element of embodiment 7, wherein the at least one first porous metal structure is completely embedded within the first outer region of the thermoelectric body.

Embodiment 9. The thermoelectric element of any one of the preceding embodiments, wherein the at least one first porous metal structure includes at least one metal mesh, or at least one metal foam, or any combination thereof.

Embodiment 10. The thermoelectric element of embodiment 9, wherein the at least one first porous metal structure includes at least one metal mesh.

Embodiment 11. The thermoelectric element of embodiment 10, wherein the at least one metal mesh has a mesh size of at least 100 mesh and not greater than 400 mesh.

Embodiment 12. The thermoelectric element of embodiment 9, wherein the at least one porous metal structure includes at least one metal foam.

Embodiment 13. The thermoelectric element of embodiment 12, wherein the at least one metal foam comprises a porosity of at least 20 vol % and not greater than 95 vol %, and an average pore size from 0.02 mm to 0.25 mm.

Embodiment 14. The thermoelectric element of embodiments 12 or 13, wherein the at least one metal foam has a density of at least 1.5 g/cm$^3$, or at least 2.0 g/cm$^3$, or at least 2.5 g/cm$^3$, or at least 3.0 g/cm$^3$, and not greater than 3.5 g/cm3, or not greater than 3.3 g/cm3, or not greater than 3.0 g/cm$^3$.

Embodiment 15. The thermoelectric element of any one of embodiments 2 to 14, wherein the first metal layer has a different stress than the second metal layer.

Embodiment 16. The thermoelectric element of embodiment 15, wherein a stress of the first metal layer is at least 70 MPa, such as at least 150 MPa, or at least 300 MPa, or at least 450 MPa, or at least 650 MPa, such as at least 700 MPa, or at least 750 MPa, or at least 800 MPa, or at least 850 MPa, or at least 900 MPa, or at least 1000 MPa, and not greater than 1500 MPa, or not greater than 1300 MPa, or not greater than 1100 MPa; and a stress of the second metal layer is at least 5 MPa, or at least 10 MPa, or at least 50 MPa, or at least 100 MPa, and not greater than 600 MPa, such as not greater than 550 MPa, or not greater than 500 MPa, or not greater than 450 MPa, or not greater than 400 MPa, or not greater than 350 MPa, or not greater than 300 MPa, or not greater than 150 MPa, or not greater than 100 MPa, or not greater than 80 MPa.

Embodiment 17. The thermoelectric element of any one of embodiments 2-16, wherein a thickness ratio of the first metal layer to the second metal layer is not greater than 0.1, such as not greater than 0.05, not greater than 0.033, not greater than 0.025, not greater than 0.02, not greater than 0.017, or not greater than 0.014.

Embodiment 18. The thermoelectric element of any one of embodiments 2-17, wherein an average thickness of the first metal layer is at least 10 nm or at least 30 nm or at least or at least 50 nm or at least 100 nm, or at least 150 nm or at least 200 nm.

Embodiment 19. The thermoelectric element of any one of embodiments 2-18, wherein an average thickness of the first metal layer is not greater than 2000 nm or not greater than 1500 nm or not greater than 1000 nm or not greater than 800 nm or not greater than 500 nm or not greater than 300 nm.

Embodiment 20. The thermoelectric element of any one of embodiments 2-19, wherein an average thickness of the second metal layer is at least 5 microns, or at least 10 microns, or at least 50 microns, or at least 80 microns, or at least 100 microns, or at least 150 microns.

Embodiment 21. The thermoelectric element of any one of embodiments 2-20, wherein an average thickness of the second metal layer is not greater than 200 microns, or not greater than 180 microns, or not greater than 160 microns, or not greater than 140 microns, or not greater than 120 microns.

Embodiment 22. The thermoelectric element of any one of the preceding embodiments, wherein the first contact structure further comprises an outer layer including silver.

Embodiment 23. The thermoelectric element of any one of the preceding embodiments, wherein the thermoelectric body comprises an n-type semiconductor material.

Embodiment 24. The thermoelectric element of any one of the preceding embodiments, wherein the thermoelectric body comprises a material including lead telluride (PbTe).

Embodiment 25. The thermoelectric element of any one of embodiments 1-22, wherein the thermoelectric body comprises a p-type semiconductor material.

Embodiment 26. The thermoelectric element of embodiment 25, wherein the thermoelectric body comprises a material including Te/Sb/Ge/Ag (TAGS).

Embodiment 27. The thermoelectric element of any one of the preceding embodiments, wherein the second contact structure is the same as the first contact structure and the second contact structure is attached to the thermoelectric body at a second outer region of the thermoelectric body, the second outer region being opposite to the first outer region.

Embodiment 28. The thermoelectric element of any one of embodiments 1-26, wherein the second contact structure is different than the first contact structure.

Embodiment 29. The thermoelectric element of embodiment 28, wherein the thermoelectric element includes an additional functional layer between the second contact structure and the thermoelectric body.

Embodiment 30. The thermoelectric element of embodiment 29, wherein the additional functional layer includes a semiconductor layer or a segmented semiconductor body.

Embodiment 31. The thermoelectric element of embodiment 29, wherein the thermoelectric body is a p-type semiconductor and the additional functional layer is an n-type semiconductor.

Embodiment 32. The thermoelectric element of embodiment 29, wherein the thermoelectric body is an n-type semiconductor and the additional functional layer is a p-type semiconductor.

Embodiment 33. The thermoelectric element of any one of embodiments 28-32, wherein the second contact structure includes four metal layers, each of the four metal layers including nickel.

Embodiment 34. The thermoelectric element of any one of the preceding embodiments, wherein the thermoelectric element is adapted for converting heat energy from a heat source to electrical energy, the heat source having a temperature of at least 100° C. and not greater than 650° C.

Embodiment 35. A method of forming a contact structure on a thermoelectric body, comprising:
providing a thermoelectric body having a first outer region and a second outer region, the second outer region being opposite to the first outer region;
heat treating the first and/or second outer region of the thermoelectric body, wherein heat treating causes a partial melting of the first and/or second outer region and forming of a softened first outer region and/or a softened second outer region;
embedding at least one first porous metal structure within the softened first outer region and/or at least one second porous metal structure within the softened second outer region;
cooling and solidifying the softened first outer region and/or the softened second outer region to form a first outer region comprising at least one first embedded porous metal structure and/or a second outer region comprising at least one second embedded porous metal structure;
applying at least one metal layer overlying an outer surface of the first outer region and/or at least one metal layer overlying an outer surface of the second outer region, wherein the at least one metal layer is in direct contact with the at least one first embedded porous metal structure and/or the at least one metal layer is in direct contact with the at least one second embedded porous metal structure.

Embodiment 36. The method of embodiment 35, wherein heat treating is conducted by induction heating.

Embodiment 37. The method of embodiment 36, wherein induction heating comprises heating the at least one first porous metal structure to a temperature of at least the melting temperature of a material of the thermoelectric body while the at least one first porous metal structure is in direct contact with an outer surface of the outer region of the thermoelectric body.

Embodiment 38. The method of embodiments 36 or 37, wherein induction heating comprises heating the at least one first porous metal structure to a temperature between 120° C. and 180° C. for 40-200 seconds, followed by heating the porous metal structure to a maximum temperature of at least 350° C. and not greater than 1200° C. for a time between 5 to 20 seconds.

Embodiment 39. The method of embodiment 38, wherein the maximum temperature during heat treating is not greater than 100° C. above the melting temperature of the material of the thermoelectric body, such as not greater than 70° C., or not greater than 50° C., or not greater than 30° C., or not greater than 10° C.

Embodiment 40. The method of any one of embodiments 35-39, wherein embedding the at least one first porous metal structure and the at least one second porous metal structure within the first outer region and the second outer region of the thermoelectric body is conducted by applying pressure during or after heat treating.

Embodiment 41. The method of any one of embodiments 35-40, further comprising polishing an outer surface of the first and/or second outer region after embedding the at least one first porous metal structure and/or the at least one second porous metal structure, wherein polishing is conducted by removing material from the first and/or second outer region until portions of the first porous metal structure and/or second porous metal structure reach the outer surface of the first outer region and/or second outer region of the thermoelectric body.

Embodiment 42. The method of any one of embodiments 35-41, wherein the first metal layer is applied by electroplating.

Embodiment 43. The method of any one of embodiments 35-42, further comprising applying a second metal layer directly overlying the first metal layer, wherein the second metal layer includes a same metal as the first metal layer.

Embodiment 44. The method of embodiment 43, wherein the at least one porous metal structure, the first metal layer, and the second metal layer include nickel.

Embodiment 45. The method of embodiment 44, wherein the at least one porous metal structure, the first metal layer, and the second metal layer consist essentially of nickel.

Embodiment 46. The method of any one of embodiments 43-45, wherein the first metal layer has a different stress than the second metal layer.

Embodiment 47. The method of any one of embodiments 35-46, wherein the thermoelectric body is an n-type thermoelectric material.

Embodiment 48. The method of any one of embodiments 35-47, wherein the thermoelectric body comprises a material including lead telluride (PbTe).

Embodiment 49. The method of any one of embodiments 35-46, wherein the thermoelectric body comprises a p-type semiconductor material.

Embodiment 50. The method of embodiment 49, wherein the thermoelectric body comprises a material including Te/Sb/Ge/Ag (TAGS).

Embodiment 51. The method of any one of embodiments 35-50, wherein the first contact structure comprises at least one first porous metal structure embedded within a first outer region of the thermoelectric body, and the second contact structure comprises at least one second porous metal structure embedded within a second outer region of the thermoelectric body, the second outer region being opposite to the first outer region.

Embodiment 52. The method of any one of embodiments 35-51, wherein the second contact structure has a same structure as the first contact structure and is concurrently formed with the first contact structure.

Embodiment 53. The method of any one of embodiments 35-51, wherein the second contact structure has a different structure than the first contact structure.

Embodiment 54. The method of embodiment 53, wherein the second contact structure does not include a porous metal structure.

Embodiment 55. The method of embodiment 54, wherein the second contact structure includes at least one metal layer.

Embodiment 56. The method of embodiment 55, wherein the second contact structure includes four nickel layers.

Embodiment 57. The method of any one of embodiments 35-56, wherein the thermoelectric body comprises before heat treating at least one provisional metal layer directly overlying the first outer region and/or the second outer region of the thermoelectric body, and heat treating and partial melting of the first outer region and/or second outer region causing a chemical reaction of the at least one provisional metal layer with a material of the thermoelectric body.

Embodiment 58. The method of embodiment 57, wherein the at least one provisional metal layer has a thickness of at least 1 micron and not greater than 7 microns.

Embodiment 59. The method of embodiments 57 or 58, wherein the at least one provisional metal layer includes two metal layers within one outer region.

Embodiment 60. The method of any one of embodiments 57-59, wherein the at least one provisional metal layer includes nickel.

Embodiment 61. The method of any one of embodiments 57-60, wherein the at least one provisional metal layer comprises two provisional nickel layers.

Embodiment 62. The method of embodiment 61, wherein the two provisional nickel layers include a first nickel layer directly overlying the outer region of the thermoelectric body having a thickness of at least 20 nm and not greater than 1 micron, and a second provisional nickel layer directly overlying the first provisional nickel layer having a thickness of at least 1 micron and not greater than 6 microns.

Embodiment 63. The method of embodiment 62, wherein the first provisional nickel layer has a higher stress than the second provisional nickel layer.

Embodiment 64. A method of forming a first contact structure and a second contact structure on a thermoelectric body, comprising:
 providing an arrangement, the arrangement comprising in the following order:
  at least one first porous metal structure;
  a thermoelectric body;
  at least one second porous metal structure;
 placing the arrangement in a furnace, the furnace comprising induction heating elements;
 induction heating the at least one first porous metal structure and the at least one second porous metal structure, wherein heat from the at least one first porous metal structure and the at least one second porous metal structure causes a partial melting and softening of a first outer region and a second outer region of the thermoelectric body, respectively;
 embedding the at least one first porous metal structure at least partially within the first outer region of the thermoelectric body to form an embedded first porous metal structure and embedding the at least one second porous metal structure at least partially within the second outer region of the thermoelectric body to form an embedded second porous metal structure; and
 applying at least one metal layer on the first outer region and at least one metal layer on the second outer region of the thermoelectric body, wherein the at least one metal layer is in direct contact with the first embedded porous metal structure and with the second embedded porous metal structure.

Embodiment 65. The method of embodiment 64, wherein the arrangement further comprises a first induction heat absorber layer surrounded by a first and second heat spreading layer, and a second induction heat absorber layer surrounded by a third and fourth heat spreading layer, the arrangement having the following order:
 a first heat spreading layer;
 a first heat induction heat absorber layer;
 a second heat absorber layer;
 the at least one first porous metal structure;
 the thermoelectric body;
 the at least one second porous metal structure;
 a third heat spreading layer;
 a second induction heat absorbing layer; and
 a fourth heat spreading layer.

Embodiment 66. The method of embodiments 64 or 65, wherein embedding the at least one first porous metal structure and the at least one second porous metal structure is conducted by compressing the arrangement during or after induction heating.

Embodiment 67. The method of any one of embodiments 64-66, wherein induction heating is conducted by a first heat treatment, the first heat treatment comprising heating the at least one first porous metal structure and the at least one second porous metal structure for at least 40 seconds and no longer than 160 seconds at a temperature of 120° C. to 180° C. followed by a second heat treatment, the second heat treatment comprising heating the at least one first and the at least one second porous metal structure and for at least 5 second and not longer than 20 seconds at a maximum temperature of at least a melting temperature of the thermoelectric body and not greater than 100° C. above the melting temperature.

Embodiment 68. The method of embodiment 67, wherein induction heating is conducted by heating the at least one first porous metal structure and the at least one second porous metal structure to a maximum temperature not greater than 50° C. above the melting temperature of the thermoelectric material.

Embodiment 69. The method of any one of embodiments 64-68, further comprising polishing the thermoelectric body after embedding the at least one first porous metal structure and the at least one second porous metal structure and before applying the at least one first metal layer, wherein polishing is conducted until the at least one first porous metal structure and the at least one second porous metal structure reach an outer surface of the first outer region and an outer surface of the at least one second outer region, respectively.

Embodiment 70. The method of any one of embodiments 64-69, wherein applying the at least one first metal layer comprises applying a first metal layer and a second metal layer, the second metal layer directly overlying the first metal layer.

Embodiment 71. The method of embodiment 70, wherein the at least on first porous metal structure, the at least one second porous metal structure, the first metal layer, and the second metal layer include nickel.

Embodiment 72. The method of embodiment 71, wherein the at least on first porous metal structure, the at least one second porous metal structure, the first metal layer, and the second metal layer consist essentially of nickel.

Embodiment 73. The method of any one of embodiments 70-72, wherein the first metal layer has a different phase than the second metal layer.

Embodiment 74. The method of embodiment 73, wherein the first metal layer has a different stress than the second metal layer.

Embodiment 75. The method of any one of embodiments 67-74, wherein induction heating is controlled by measuring an electric current flowing through coils of an induction heater.

Embodiment 76. The method of embodiment 75, wherein induction heating is stopped by measuring an increase of the electric current of 3-5% during the second heat treatment.

Embodiment 77. An induction heating system comprising:
 a furnace chamber comprising a non-magnetic and non-conductive furnace wall;
 an induction heating device including least one induction heating coil surrounding an outer side of the furnace wall in a length direction (z) of the furnace chamber; and a holding and pressing construction;
wherein the holding and pressing construction is designed to hold an arrangement to be placed within the furnace chamber, and the holding and pressing construction can apply a pressure on a proximal end and a distal end of the arrangement in the length direction of the chamber.

Embodiment 78. The induction heating system of embodiment 77, further comprising a temperature sensor designed for measuring a temperature of a layer of the arrangement.

Embodiment 79. The induction heating system of embodiment 78, wherein the temperature sensor is an infrared temperature sensor.

Embodiment 80. The induction heating system of any one of embodiments 77-79, further comprising an inlet and an outlet for applying a controlled flow of an inert gas through the furnace chamber.

Embodiment 81. The induction heating system of any one of embodiments 77-80, wherein a distance $d_i$ of the induction heating coil to the outer side of the furnace wall ranges from 0 mm to 10 mm.

Embodiment 82. The induction heating system of embodiment 81, wherein the distance $d_i$ is at least 0.5 mm and not greater than 2 mm.

Embodiment 83. The induction heating system of embodiment 82, wherein the distance $d_i$ is 1.5 mm.

Embodiment 84. The induction heating system of any one of embodiments 77-83, wherein the at least one heating coil is hollow and adapted for passing an air flow through the at least one heating coil during operation of the induction heating system.

Embodiment 85. The induction heating system of any one of embodiments 77-84, wherein the holding and pressing construction is designed to apply a pressure of at least 5 psi and not greater than 15 psi on the inserted arrangement.

Embodiment 86. The induction heating system of any one of embodiments 77-85, wherein the induction heating system further comprises a control unit and an induction heating device.

Embodiment 87. The induction heating system of embodiment 86, wherein the control unit is connected to the induction heating device and to the temperature sensor.

Embodiment 88. The induction heating system of embodiments 86 or 87, wherein the control unit is adapted for regulating a desired current frequency and heating time for operating the at least one induction heating coil.

Embodiment 89. The induction heating system of any one of embodiments 77-88, wherein the induction heating system is adapted for varying a current frequency during induction heating.

Embodiment 90. The induction heating system of embodiment 89, wherein the current frequency is at least 80 kHz, or at least 100 kHz, or at least 200 kHz.

Embodiment 91. The induction heating system of embodiments 89 or 90, wherein the current frequency is not greater than 10 MHz, or 1 MHz or 500 kHz.

Embodiment 92. The induction heating system of any one of embodiments 86-91, wherein the induction heating system is adapted to measure an electric current flow through the at least one heating coil.

Embodiment 93. The induction heating system of embodiment 92, wherein the electric current is observed by the control unit, and the control unit is configured to stop induction heating related to a pre-determined electric current increase within the at least one heating coil.

Embodiment 94. The induction heating system of any one of embodiments 77-93, further comprising an ampere meter adapted for measuring an electric current flow of an induction heating coil circuit during operation of the induction heating system.

Embodiment 95. The induction heating system of embodiment 94, wherein the ampere meter is connected to the control unit.

Embodiment 96. The induction heating system of embodiment 95, wherein the electric current is observed by the control unit, and the control unit is configured to stop induction heating related to a pre-determined electric current increase within the at least one heating coil.

Embodiment 97. The induction heating system of embodiment 96, wherein the control unit is configured to monitor current values obtained from the ampere meter and to stop induction heating according to a pre-determined electric current increase within the heating coil circuit.

Embodiment 98. The induction heating system of embodiment 97, wherein the pre-determined electric current increase is 3-5% compared to a current flow when reaching a pre-determined base temperature recorded by the temperature sensor.

Embodiment 99. The induction heating system of any one of embodiments 77-98, wherein the induction heating system is designed for conducting induction heating of an inserted arrangement up to a temperature of 1200° C.

EXAMPLES

The following non-limiting examples illustrate the present invention.

Example 1

Preparing of a Thermoelectric Element Comprising a Thermoelectric Body Including a p-Type TAGS with Embedded Nickel Mesh.

A round thermoelectric body including a p-type TAGS material and having a diameter of 20 mm and a thickness of 2 mm was polished on both surfaces with a mechanical polisher containing an 800 grits polishing pad to obtain a smooth outer surface having a surface roughness between 10 to 15 microns.

Thereafter, an arrangement was assembled placing the TAGS body in the center of the arrangement. The arrangement had the following layered structure: a first graphite heat spreading layer (71), an induction heat absorber layer (72), a second graphite heat spreading layer (73), two nickel meshes (74), the above-described TAGS thermoelectric body (75); two further nickel meshes (76), a third graphite heat spreading layer (77), a second induction heat absorbing layer (78); and a fourth graphite heat spreading layer (79), see also FIG. 7. Each of the two nickel meshes had a mesh count of 350 mesh/inch, an average wire diameter of 30 microns, and a thickness of about 40 microns, leading to a total thickness of 80 microns nickel mesh on each outer region of the thermoelectric body. The inner heat spreading layers (i.e., second and third heat spreading layers 73 and 77) had a thickness of 0.5 mm, and the outer heat spreading layers (i.e., the first and fourth heat spreading layers 71 and 79) had a thickness of 1 mm. The two induction heat absorbing layers (72 and 78) included each one nickel mesh having a thickness of 40 microns, which was of the same type of nickel mesh as placed next to the outer regions of the TAGS body (74 and 76).

The arrangement was placed in a furnace designed for induction heating, as illustrated in FIG. 8. The arrangement (86) was fixed within the furnace chamber (81) by the holding and pressing construction (85) and a pressure of about 0.05 MPa (8 psi) was applied from the top and the bottom on the arrangement.

After the arrangement was placed in the furnace chamber, an argon gas (95% Argon:5% Hydrogen) was led through the chamber for about 2 minutes to provide oxygen-free conditions. The flow rate of the argon gas through the furnace was about 50 ml/min. Thereafter, induction heating was conducted by heating the induction heating elements (herein also called tooling) to a temperature of 160° C. for 140 seconds, followed by increasing the temperature of the tooling to 320° C. for a time of about 6-8 seconds. The tooling was positioned at a distance of 1.5 mm next to the wafer.

The use of the induction heating elements allowed for rapid heating of the nickel mesh to a temperature of about 630° C., which is close to the melting temperature of the TAGS body. The applied current frequency was about 100 kHz. The argon gas flow was maintained at the same flow rate during the whole processing within the chamber.

The induction heating caused a melting of the first and second outer region of the TAGS body, and an embedding of the metal meshes within the outer regions while the arrangement stayed under the same pressure.

After cooling to a temperature of about 70° C., the arrangement was taken out of the furnace chamber.

The thermoelectric body containing the embedded nickel meshes was subjected to mechanical polishing using 600 and 800 grit lapping pads until the metal mesh reached the outer surface of the TAGS body on both sides. The amount of TAGS material removed from the surface was about 10 microns until the nickel mesh reached the outer surface.

Thereafter, the polished TAGS body including the embedded fiber meshes was subjected to a first nickel electroplating to deposit a first nickel layer having a thickness of about 50 nm. The electroplating of the first nickel layer was conducted using the plating system and conditions described below, wherein the plating bath was adjusted to a pH of about 8.0.

After electroplating the first nickel layer, the plating bath was changed, by using a bath having the same ingredients but an adjusted pH of about 4.0, and a second nickel electroplating was conducted to deposit a second nickel layer having a thickness of about 10 microns.

Figure 6:
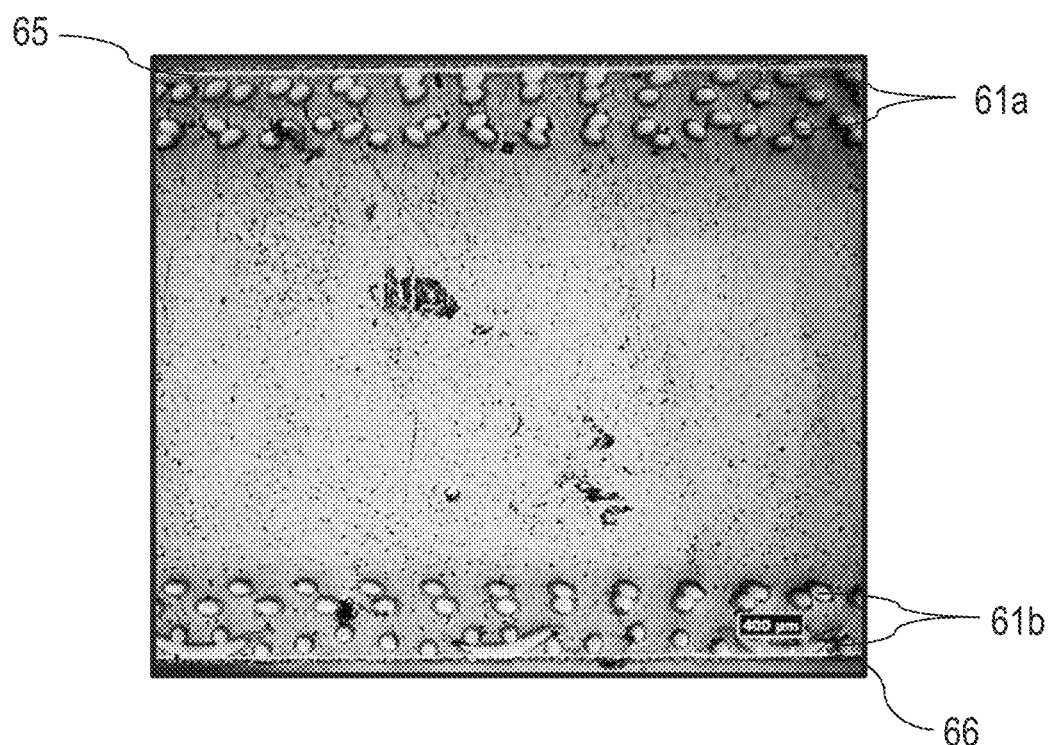
FIG. 6 includes an optical image of a crosscut of a thermoelectric element according to one embodiment.

An optical image of the thermoelectric TAGS body with two embedded nickel meshes within each of the first and second outer regions can be seen in FIG. 6. It can be seen that the metal meshes (61a, 61b) were completely embedded within the outer regions of the TAGS body, and the nickel plated layers (65, 66) were in direct contact with the embedded metal meshes (61a, 61b), respectively. The depth of the embedded nickel meshes within the thermoelectric body was about 350 microns.

After the electroplating of the second nickel layer, a silver layer having a thickness of about 15 microns was deposited on top of the second nickel layer.

Nickel Electroplating

The plating system contained a nickel anode, and a 400 ml plating bath, into which a plurality of four thermoelectric bodies, herein also called wafers, were inserted. The plating bath contained nickel sulphamate and had a temperature during the plating at laboratory room temperature of 23-25° C. The four wafers were placed parallel to each other and connected to a voltage source. Between each wafer and the voltage source was placed a precision resistor. The electroplating was conducted under the condition that the plating bath had a high resistance of about 500 Ohm, while the wafers had a low resistance. The resistance of the wafers was in a range of 0.1 to 0.5 mOhm and was more than 10,000 times lower than the resistance of the precision resistors, such that the following equation (1) applied: r×10,000<R (1), with R being the resistance of the precision resistor, and r being the resistance of the wafer.

By using the above-described plating system, it was possible to form uniform layers on non-uniform substrates (wafers). For example, if wafers had a resistance span of 0.1 to 0.5 mOhm, uniform nickel layers of a controlled thickness between 1-20 microns could be formed, with minor thickness variation.

Example 2

Preparing of a Thermoelectric Element Comprising a Thermoelectric Body Including PbTe with Embedded Nickel Mesh.

A round thermoelectric body including n-type doped lead telluride (PbTe) having a diameter of 20 mm and a wafer thickness of 2 mm, was polished on both surfaces using a mechanical polisher with an 800 grits polishing pad to obtain a smooth outer surface having a surface roughness between 10 to 15 microns.

After the polishing, the surface of the PbTe body was etched using a 2:1 water to nitric acid treatment solution for 1 minute in order to remove about 2-10 microns from the outer surface and to activate the surface towards nickel plating. Following the etching, the surface was cleaned with de-ionized water and dried with dry nitrogen spray at room temperature.

Thereafter, the polished PbTe body was subjected to nickel electroplating to deposit a first provisional nickel layer having a thickness of about 50 nm, wherein the plating bath was adjusted to a pH of about 8.0. After electroplating the first provisional nickel layer, a second provisional nickel layer having a thickness of 5 microns was electroplated directly over the first provisional nickel layer. The plating bath for plating the second provisional nickel layer had a pH of 4 but was otherwise the same as for plating the first provisional nickel layer.

Thereafter, an arrangement was assembled placing the thermoelectric body including the two provisional nickel layers in the center of the arrangement. The arrangement had the same layered structure as described in Example 1, except that the thickness of each of the four graphite heat spreading layers was 0.5 mm.

The arrangement was placed in a furnace designed for induction heating, as illustrated in FIG. 8. The arrangement (86) was fixed within the furnace chamber (81) by the holding and pressing construction (85) and a pressure of about 8 psi was applied from the top and the bottom on the arrangement.

After the arrangement was placed in the furnace chamber, an argon gas (Argon 95%:Hydrogen 5%) was led through the furnace chamber for 2 minutes to provide oxygen-free heating conditions, before starting the conduction heating with a flow rate of 50 ml/min. The argon gas flow was maintained during the induction heating and cooling after the heating. Induction heating was conducted by heating the tooling to a temperature of 160° C. and holding the temperature for about 150 seconds, followed by increasing the tooling temperature to 455° C. and holding the temperature for a time of 6-8 seconds. The applied current frequency was 100 kHz.

The induction heating caused a heating of the metal meshes to a temperature of about 920° C., which caused melting of the first and second outer regions of the PbTe body, and a complete embedding of the metal meshes within the outer regions while the submitted pressure on the arrangement was maintained. The provisional nickel layers that were applied on the thermoelectric body before induction heating reacted with the melted PbTe material and could not be observed anymore after embedding the nickel meshes. After the arrangement has cooled down to a temperature of about 70° C., the arrangement was removed from the induction heating system and the thermoelectric body containing the embedded nickel meshes was subjected to mechanical polishing using 600 and 800 grit lapping paper until the metal mesh reached the outer surface of the PbTe body on both sides. The amount of PbTe material removed from the surface was about 30 microns until the nickel mesh reached the outer surface.

Thereafter, the polished PbTe body was subjected to a first nickel electroplating to deposit a first nickel layer having a thickness of about 50 nm. The electroplating of the first nickel layer was conducted using the plating system and conditions described in Example 1, wherein the plating bath was adjusted to a pH of about 8.0.

After electroplating the first nickel layer, the plating bath was changed, by using a bath having the same ingredients but an adjusted pH of about 4.0, and a second nickel electroplating was conducted to deposit a second nickel layer having a thickness of about 10 microns.

Figure 5:
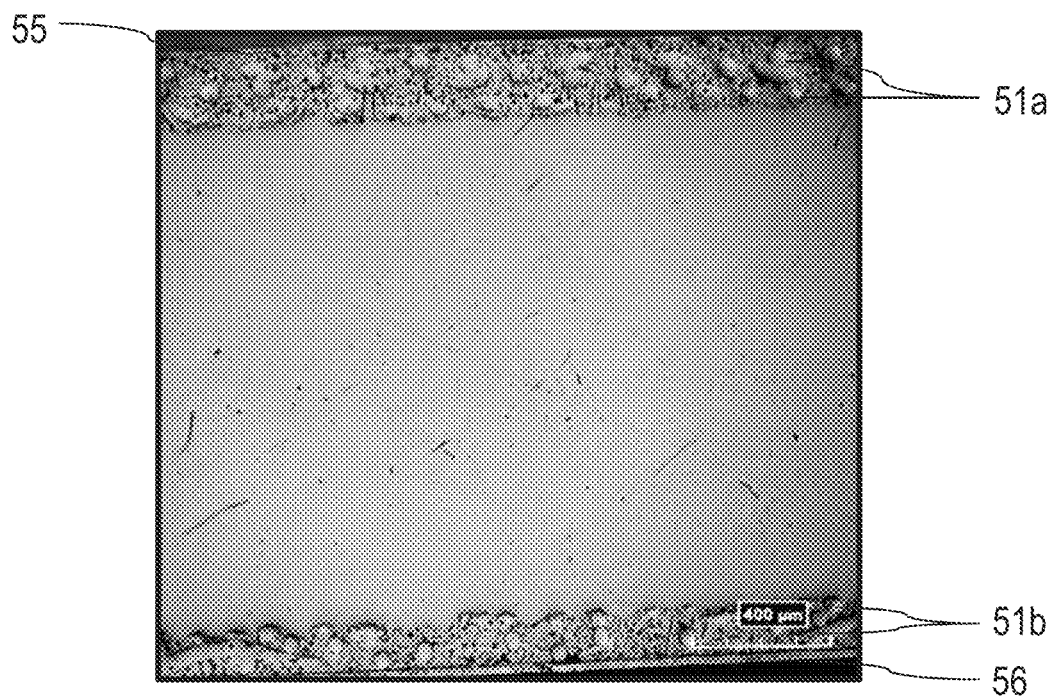
FIG. 5 includes an optical image of a crosscut of a thermoelectric element according to one embodiment.

FIG. 5 shows an optical image of the thermoelectric PbTe body containing two embedded nickel meshes (51a) within the first outer region and two embedded nickel meshes (51b) within the second outer region, and further two plated nickel layers on each side (55, 56). It can be further seen in FIG. 5 that the metal meshes were completely embedded within the first outer region and the second outer region. The depth of the embedded meshes within the thermoelectric body was about 200 microns. The provisional nickel layers applied before the induction heating on the thermoelectric body cannot be observed in FIG. 5. Not being bound to theory, it is assumed that the provisional nickel layers chemically reacted with the melted PbTe material of the outer regions and were thereby consumed.

After electroplating of the second nickel layer, a silver layer having a thickness of about 15 microns was deposited on top of the second nickel layer deposited from an AgCN bath.

The two nickel layers and the silver layer were all applied concurrently on both surfaces of the PbTe body, which are herein called a contact structure (CS01) and a second contact structure (CS02), such that each contact structure contained two nickel meshes and two nickel layers.

Example 3

Preparing of a Thermoelectric Element Comprising a Thermoelectric Body Including PbTe.

A thermoelectric element was made the same way as described in Example 2, except that no provisional nickel layers were applied on the thermoelectric PbTe body before induction heating.

It could be observed that the depth of the embedded nickel meshes was about the same as in Example 2, however, the strength of the contact structure was not as good as the contact structure described in Example 2. Not being bound to theory, it appears that the provisional nickel layers chemically reacted with the softened PbTe material and that the reaction product provides a stronger hold of the embedded nickel meshes than the PbTe material alone.

Example 4

Preparing of a Thermoelectric Element Comprising a Thermoelectric Body Including a p-Type TAGS with Embedded Nickel Foam.

The thermoelectric element including a p-type TAGS was prepared the same way as in Example 1, except that the two metal meshes on each side were replaced by a metal foam on each side. The metal foam had a thickness of about 100 microns. The metal foam was originally a nickel foam having a thickness of about 1.0-1.6 mm with a porosity of ≥95 vol % and 80-110 pores per inch (average hole diameter of 0.25 mm) and a density of 0.403 g/cm³ and was pressed down before use to a thickness of about 0.1 mm (100 microns) and a density of 3.3 g/cm³.

A further difference to Example 1 was the controlling of the induction heating. When using the metal foam induction heating was conducted by heating the tooling to a temperature of 160° C. and holding the temperature for 140 seconds, followed by increasing the tooling temperature to 320° C. and holding the temperature at 320° C. until the electric current flowing through the induction coils increased by 3-5% in comparison to the current flow detected when reaching the 320° C. temperature plateau. The electric current when reaching the 320° C. ($_{ATmax-b}$) in the tooling was about 8 A and was stopped when reaching a value of 8.3 A. Not being bound to theory, the increase in the current flow can be an indication of the reaction of the nickel foam with the TAGS body when being embedded within the outer regions; and can be related to a drop in the electromagnetic permeability of the nickel foam caused by the reaction. Stopping the heating at an increase of the electric current by 0.3 A corresponded to a time of about 6-8 seconds at the maximum tooling temperature of 320° C. Observing the increase in the current and stopping the heat treatment by detecting the current increase of 0.3 A can have the advantage of being highly sensitive corresponding to the reaction of the nickel foam with the TAGS, and may prevent unwanted damage of the TAGS by a prolonged heating time. The tooling was positioned at a distance of 1.5 mm next to the wafer. The use of the induction heating elements allowed for a rapid heating of the nickel foam to a temperature of about 630° C., which is close to the melting temperature of the TAGS body. The applied current frequency was about 100 kHz.

The argon gas flow was maintained at the same flow rate during the whole processing within the chamber.

After the induction heating, the obtained thermoelectric body containing the embedded nickel foam on each side was subjected to mechanical polishing using 600 and 800 grit lapping pads until the metal foam reached the outer surface of the TAGS body on both sides. The amount of TAGS material removed from the surface was about 10-80 microns until the nickel foam reached the outer surface.

Thereafter, the polished TAGS body including the embedded metal foams was subjected to nickel electroplating, the same way as described in Example 1, by applying a first and a second nickel layer.

Figure 10A:
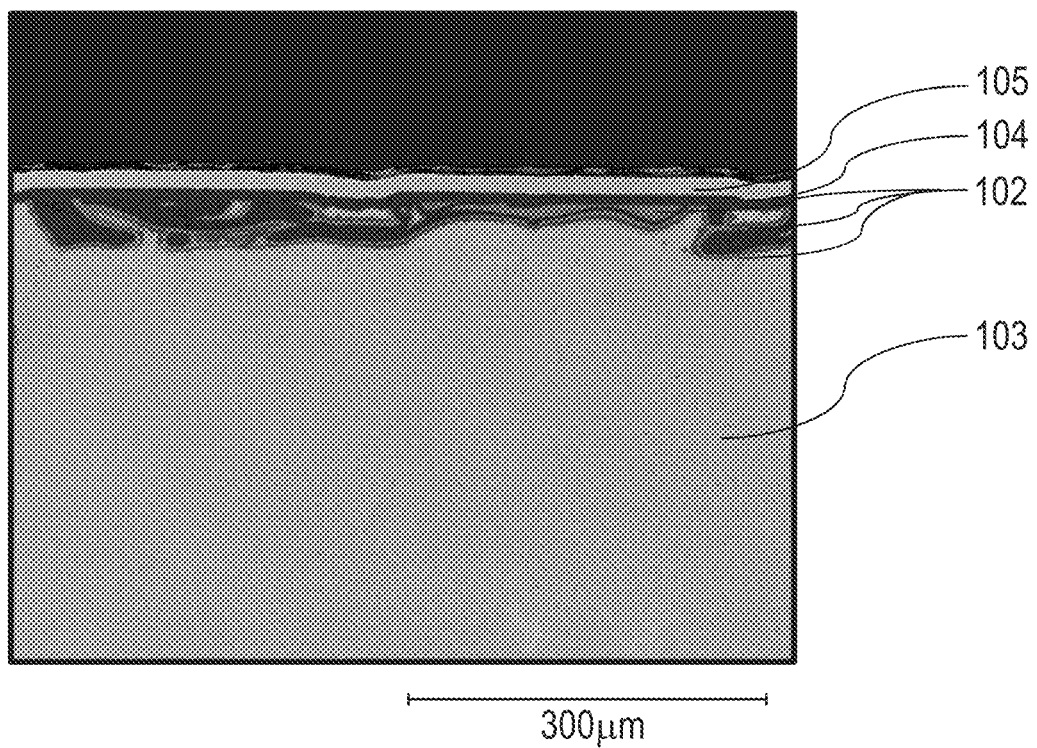
FIG. 10A includes an optical microscope image of a cross-cut of a portion of a thermoelectric element according to one embodiment.
Figure 10B:
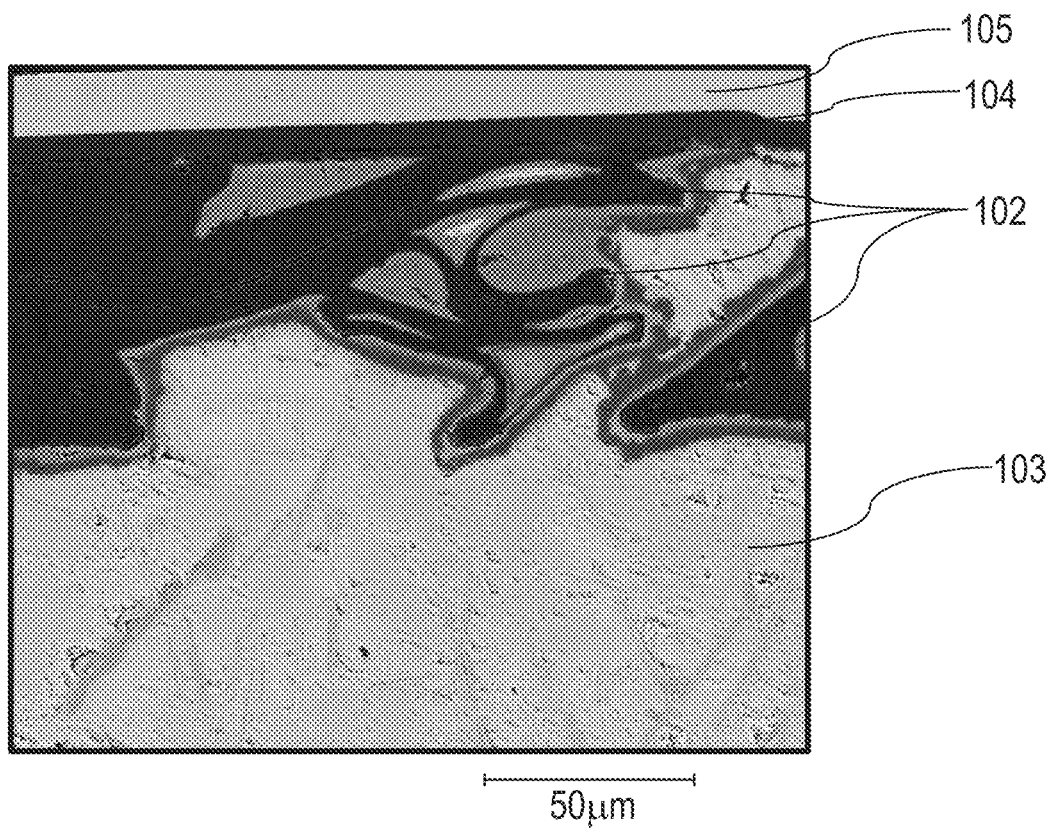
FIG. 10B includes a larger magnification of the image shown in FIG. 10A according to one embodiment.

After the electroplating of the two nickel layers, a silver layer having a thickness of about 15 microns was deposited on top of the second nickel layer, the same way as in Example 1. An optical microscope image of the thermoelectric TAGS body with embedded nickel foam in one of the outer regions can be seen in FIGS. 10A and 10B. It can be seen that the nickel foam (102) is embedded within the TAGS body (103) and partially reacted with the TAGS, above the embedded nickel foam are the electroplated nickel layers (104), followed by the electroplated silver layer (105).

Example 5

Preparing of a Thermoelectric Element Comprising a Thermoelectric Body Including PbTe with Embedded Nickel Foam.

The thermoelectric element including a PbTe was prepared the same way as in Example 2, except that the two metal meshes on each side were replaced by a metal foam on each side. The metal foam had a thickness of about 100 microns. The metal foam was originally a nickel foam having a thickness between 1.0-1.6 mm with a porosity of ≥95 vol % and 80-110 pores per inch (average hole diameter of 0.25 mm) and a density of 0.403 g/cm³ and was pressed down before use to a thickness of about 0.1 mm (100 microns) to a density of 3.3 g/cm³.

A further difference to Example 2 was the induction heating. When using the metal foam, induction heating was conducted by heating the tooling to a temperature of 160° C. and maintained for 150 seconds, followed by increasing the tooling temperature to 455° C. and holding the temperature at 455° C. until the electric current flow through the induction coil increased by 3-5% in comparison to the current flow detected when reaching the 455° C. temperature plateau. Specifically, the current was about 9 A when reaching the tooling temperature of 455° C. ($A_{Tmax-b}$) and was stopped when reaching a value of 9.3 A ($A_{Tmax-b}$+0.3 A). Not being bound to theory, the increase in the current flow can be an indication of a reaction of the nickel foam with the PbTe; and may be related to a drop in the electromagnetic permeability of the nickel foam when reacting with the PbTe material. Stopping the heating at 9.3 A (herein also indicated as $A_S$), corresponding to a time of about 6 seconds at the maximum temperature of 455° C. Observing the increase in the electric current and stopping the heat treatment by detecting the current increase of 0.3 A can have the advantage of being highly sensitive corresponding to the reaction of the nickel foam with the PbTe, and may prevent unwanted damage of the PbTe by a prolonged heating time.

The induction heating caused a heating of the metal foam to a temperature of about 920° C., which caused a melting of the first and second outer regions of the PbTe body, and a complete embedding of the metal foams within the outer regions while the submitted pressure on the arrangement was maintained. The provisional nickel layers that were applied on the thermoelectric body before induction heating reacted with the melted PbTe material and could not be observed anymore after embedding the nickel meshes.

The argon gas flow was maintained at the same flow rate during the whole processing within the chamber.

The obtained thermoelectric body containing the embedded nickel foam was subjected to mechanical polishing using 600 and 800 grit lapping pads until the metal foam reached the outer surface of the PbTe body on both sides. The amount of PbTe material removed from the surface was about 10-80 microns until the nickel mesh reached the outer surface.

Thereafter, the polished PbTe body including the embedded metal foams was subjected to nickel electroplating, the same way as described in Example 1, by applying a first and a second nickel layer.

After electroplating the nickel layers, outer silver layers were electroplated over the second nickel layers on each side the same way as described in Example 2.

Figure 11A:
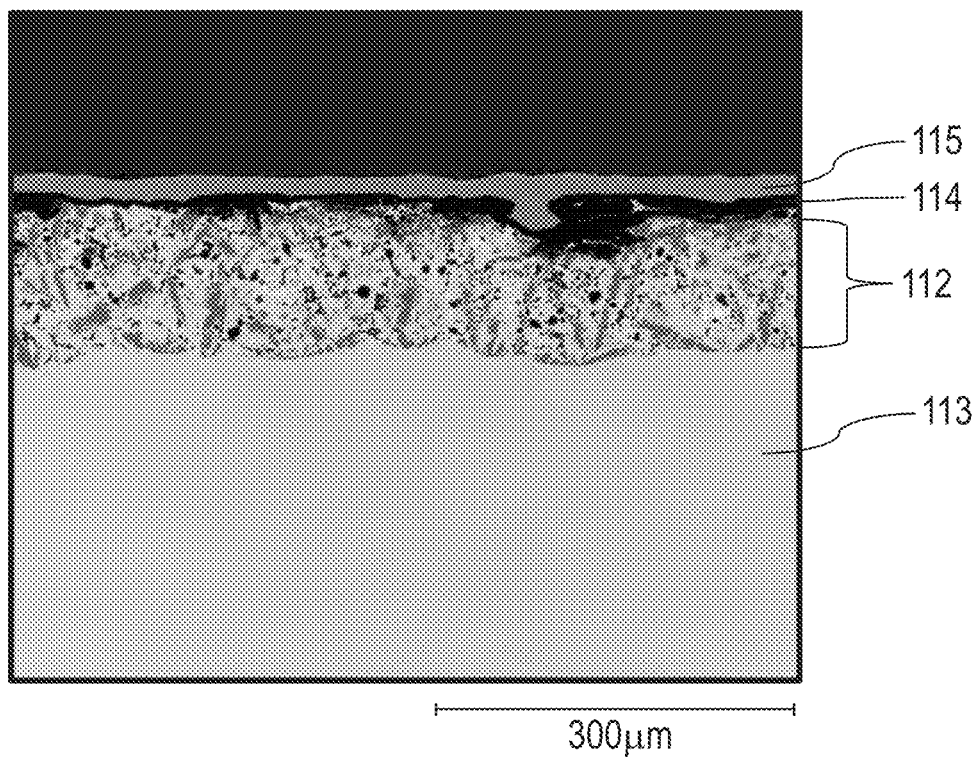
FIG. 11A includes an optical microscope image of a cross-cut of a portion of a thermoelectric element according to one embodiment.
Figure 11B:
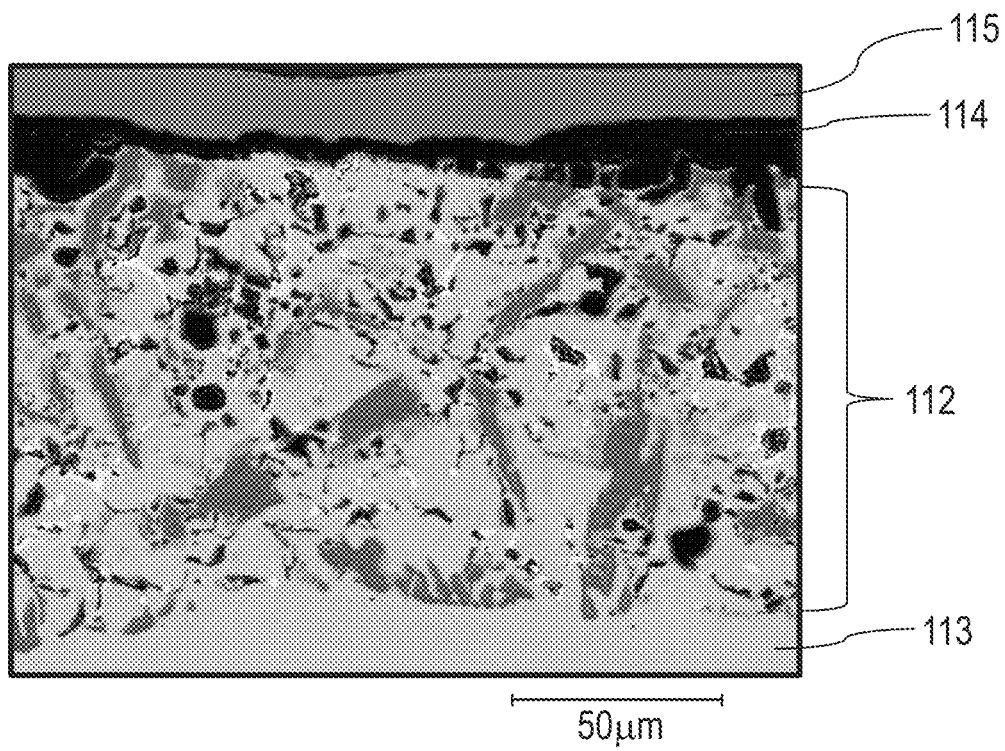
FIG. 11B includes a larger magnification of the image shown in FIG. 11A according to one embodiment.

FIGS. 11A and 11B show optical microscope images of the produced multi-layer contact structure on one side or the thermoelectric element. Region (112) is related to the nickel foam which partially reacted with the PbTe (113), followed by electroplated nickel layers (114) and the electroplated silver layer (115).

Example 6

Testing of the Life-Time/Performance of the Thermoelectric Elements.

The thermoelectric elements of Examples 1, 2, 4, and 5 were subjected to high temperature cycles and the maximum power at the peak temperature was measured during each cycle. The lifetime of a thermoelectric element was defined as the number of cycles counted when the maximum power measured decreased less than 15% as compared to the maximum power measured during the first cycle.

The thermoelectric elements of Examples 1, 2, 4, and 5 had an about 500 times higher lifetime than comparative thermoelectric elements that were made using the same thermoelectric bodies as in Examples 1 to 3, but having a multi-layer contact layer structure of a nickel (1 micron)/silver (8 microns)/indium (5 microns), and without heat treatment.

In comparison to a comparative thermoelectric element having the same thermoelectric body but, on each side, a four-layer nickel/silver layer contact structure, such as (Ni 50 nm/Ni 15 microns/Ni 50 nm/Ni 15 microns/Ag 15 microns), and no embedded nickel mesh, the thermoelectric elements of Examples 1, 2, 4 and 5 had a 40 to 60 time higher life-time.

What is claimed is:

1. An induction heating system comprising:
   a furnace chamber comprising a non-magnetic and non-conductive furnace wall;
   an induction heating device including least one induction heating coil surrounding an outer side of the furnace wall in a length direction (z) of the furnace chamber;
   an arrangement positioned within the furnace chamber, the arrangement comprising a layered structure in the following order: at least one first porous metal structure, a thermoelectric body, and at least one second porous metal structure; and
   a holding and pressing construction;
   wherein the holding and pressing construction is designed to hold the arrangement within the furnace chamber, and the holding and pressing construction can apply a pressure on a proximal end and a distal end of the arrangement in the length direction of the chamber.

2. The induction heating system of claim 1, further comprising a temperature sensor designed for measuring a temperature of a layer of the arrangement.

3. The induction heating system of claim 2, wherein the temperature sensor is an infrared temperature sensor.

4. The induction heating system of claim 1, further comprising an inlet and an outlet for applying a controlled flow of an inert gas through the furnace chamber.

5. The induction heating system of claim 4, wherein the inert gas is an argon gas.

6. The induction heating system of claim 1, wherein a distance di of the at least one induction heating coil to an outer side of the furnace wall ranges from 0 mm to 10 mm.

7. The induction heating system of claim 5, wherein the distance di is at least 0.5 mm and not greater than 2 mm.

8. The induction heating system of claim 1, wherein the at least one heating coil is hollow and adapted for passing a gas flow for cooling through the coil during operation of the induction heating system.

9. The induction heating system of claim 1, wherein the holding and pressing construction is adapted to apply a pressure of at least 5 psi and not greater than 15 psi on the arrangement.

10. The induction heating system of claim 1, wherein the induction heating system further comprises a control unit.

11. The induction heating system of claim 10, wherein the control unit is connected to the induction heating device and to a temperature sensor.

12. The induction heating system of claim 10, wherein the control unit is adapted for regulating a desired current frequency, a power, a heating time, or any combination thereof for operating the at least one induction heating coil.

13. The induction heating system of claim 1, wherein the induction heating system is adapted for varying a current frequency during induction heating, the current frequency being at least 80 kHz.

14. The induction heating system of claim 1, further comprising an ampere meter adapted for measuring an electric current flow of an induction heating coil circuit during operation of the induction heating system.

15. The induction heating system of claim 14, wherein the ampere meter is connected to the control unit.

16. The induction heating system of claim 15, wherein the control unit is configured to monitor current values obtained from the ampere meter and to stop induction heating according to a pre-determined electric current increase within the heating coil circuit.

17. The induction heating system of claim 16, wherein the pre-determined electric current increase is 3-5% compared to a current flow when reaching a pre-determined base temperature recorded by the temperature sensor.

18. The induction heating system of claim 1, wherein the induction heating system is designed for induction heating of a metal structure contained within the arrangement of up to a temperature of 1200° ° C.

19. The induction heating system of claim 1, wherein temperature regulation is conducted by alternating a power applied to the at least one induction heating coil between on and off.

20. The induction heating system of claim 1, wherein the holding and pressing construction comprises movable pedestals adapted for attaching to the proximal end and distal end of the arrangement.

* * * * *